United States Patent
Bergsma et al.

(10) Patent No.: US 10,554,188 B2
(45) Date of Patent: Feb. 4, 2020

(54) TRANSIENT OUTPUT SUPPRESSION IN AN AMPLIFIER

(71) Applicant: SKYWORKS SOLUTIONS, INC., Woburn, MA (US)

(72) Inventors: Adrian John Bergsma, Ottawa (CA); Thomas Obkircher, Santa Ana, CA (US); Peihua Ye, Irvine, CA (US); Bang Li Liang, Ottawa (CA); Peter Harris Robert Popplewell, Ottawa (CA); William J. Domino, Yorba Linda, CA (US)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 0 days.

(21) Appl. No.: 15/808,372

(22) Filed: Nov. 9, 2017

(65) Prior Publication Data

US 2018/0138877 A1    May 17, 2018

Related U.S. Application Data

(60) Provisional application No. 62/420,907, filed on Nov. 11, 2016.

(51) Int. Cl.
*H03F 3/45* (2006.01)
*H03G 3/20* (2006.01)
(Continued)

(52) U.S. Cl.
CPC ............ *H03G 3/20* (2013.01); *H03F 3/2175* (2013.01); *H03M 1/0881* (2013.01); *H03M 1/66* (2013.01)

(58) Field of Classification Search
CPC .............. H03F 3/387; H03F 2200/261; H03F 2203/45138; H03F 3/393; H03F 1/26
(Continued)

(56) References Cited

U.S. PATENT DOCUMENTS 6,144,535 A    11/2000  Ishii
6,201,441 B1 *  3/2001  Suematsu ............... H03F 3/19
                                                    330/51

(Continued)

OTHER PUBLICATIONS

"BGA3131 DOCSIS 3.1 upstream amplifier Product data sheet", NXP Semiconductors N.V., 2016, <https://www.nxp.com/docs/en/data-sheet/BGA3131.pdf> [retrieved from the Internet on Dec. 12, 2017].

(Continued)

*Primary Examiner* — Khanh V Nguyen
*Assistant Examiner* — Khiem D Nguyen
(74) *Attorney, Agent, or Firm* — Lando & Anastasi, LLP

(57) ABSTRACT

Systems and methods for suppressing transient outputs from an amplifier system are provided. An amplifier having a plurality of bias levels may be controlled to initiate a change in the level of a bias signal provided to the amplifier. The level of the bias signal is ramped from an initial bias level to a final bias level over numerous steps. The steps include at least one step in which the level of the bias signal is between the initial bias level and the final bias level. An amplifier system having multiple stages may be controlled to enable each stage and selectively couple each stage in a sequence that couples an output stage to an output terminal at the completion of the sequence.

27 Claims, 14 Drawing Sheets

(51) Int. Cl.
*H03M 1/66* (2006.01)
*H03M 1/08* (2006.01)
*H03F 3/217* (2006.01)

(58) Field of Classification Search
USPC ............. 330/51, 254; 455/127.1–127.5
See application file for complete search history.

(56) References Cited

U.S. PATENT DOCUMENTS

| | | | | |
|---|---|---|---|---|
| 6,208,203 | B1* | 3/2001 | Jung | H03F 1/526 |
| | | | | 330/124 D |
| 6,408,069 | B1 | 6/2002 | Furlong | |
| 7,342,955 | B2* | 3/2008 | Forest | H03F 1/0205 |
| | | | | 375/219 |
| 7,649,418 | B2 | 1/2010 | Matsui | |
| 7,952,433 | B2* | 5/2011 | An | H03F 1/0266 |
| | | | | 330/295 |
| 8,446,143 | B2 | 5/2013 | Whittington et al. | |
| 2003/0058041 | A1 | 3/2003 | Koizumi | |
| 2011/0256857 | A1 | 10/2011 | Chen et al. | |
| 2016/0248462 | A1 | 8/2016 | Danilenko et al. | |

OTHER PUBLICATIONS

"ARA2000 Address-Programmable Reverse Amplifier with Step Attenuator Data Sheet", Skyworks Solutions, Inc., 2016, <http://www.skyworksinc.com/uploads/documents/ARA2000_204228B.pdf> [retrieved from the Internet on Dec. 15, 2017].

"ARA05050 Reverse Amplifier with Step Attenuator Data Sheet", Skyworks Solutions, Inc., 2016, <http://www.skyworksinc.com/uploads/documents/ARA05050_204227B.pdf> [retrieved from the Internet on Dec. 15, 2017].

3.3 V, Upstream Cable Line Driver, AD8324, Analog Devices, Inc., 2016, <http://www.analog.com/media/en/technical-documentation/data-sheets/AD8324.pdf> [retrieved from the Internet on Dec. 15, 2017].

"DOCSIS 3.0 Upstream Amplifier", Maxim, 2009, <https://media.digikey.com/pdf/Data%20Sheets/Maxim%20PDFs/MAX3518.pdf> [retrieved from the Internet on Dec. 15, 2017].

* cited by examiner

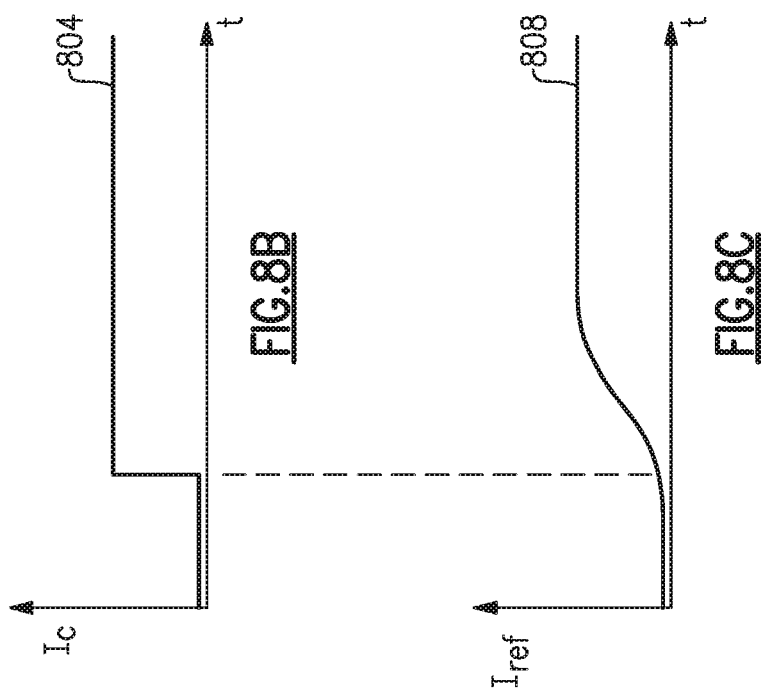
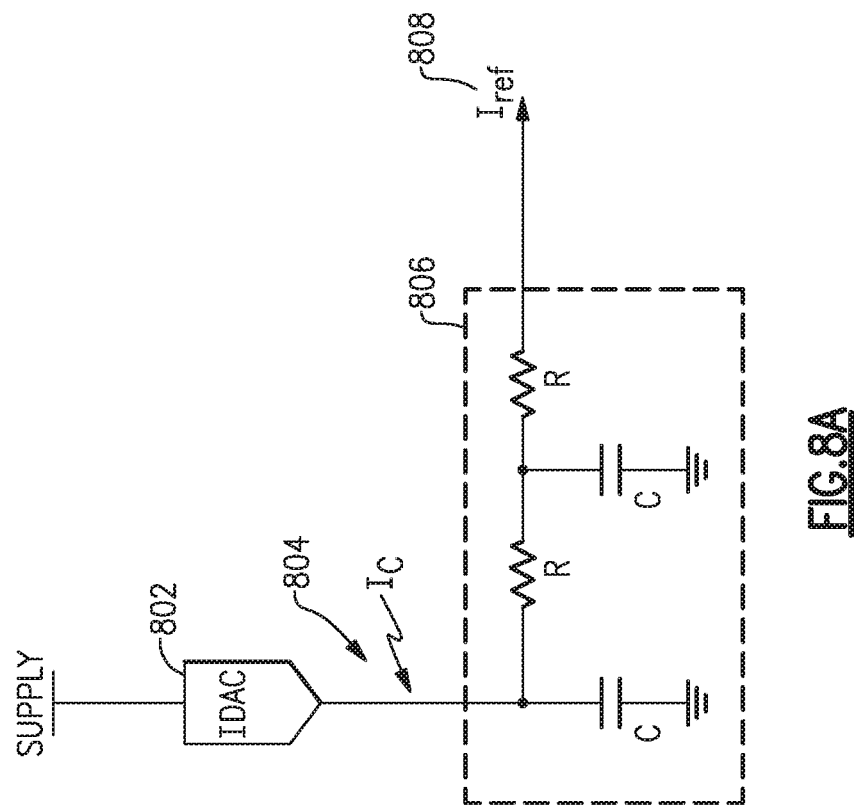

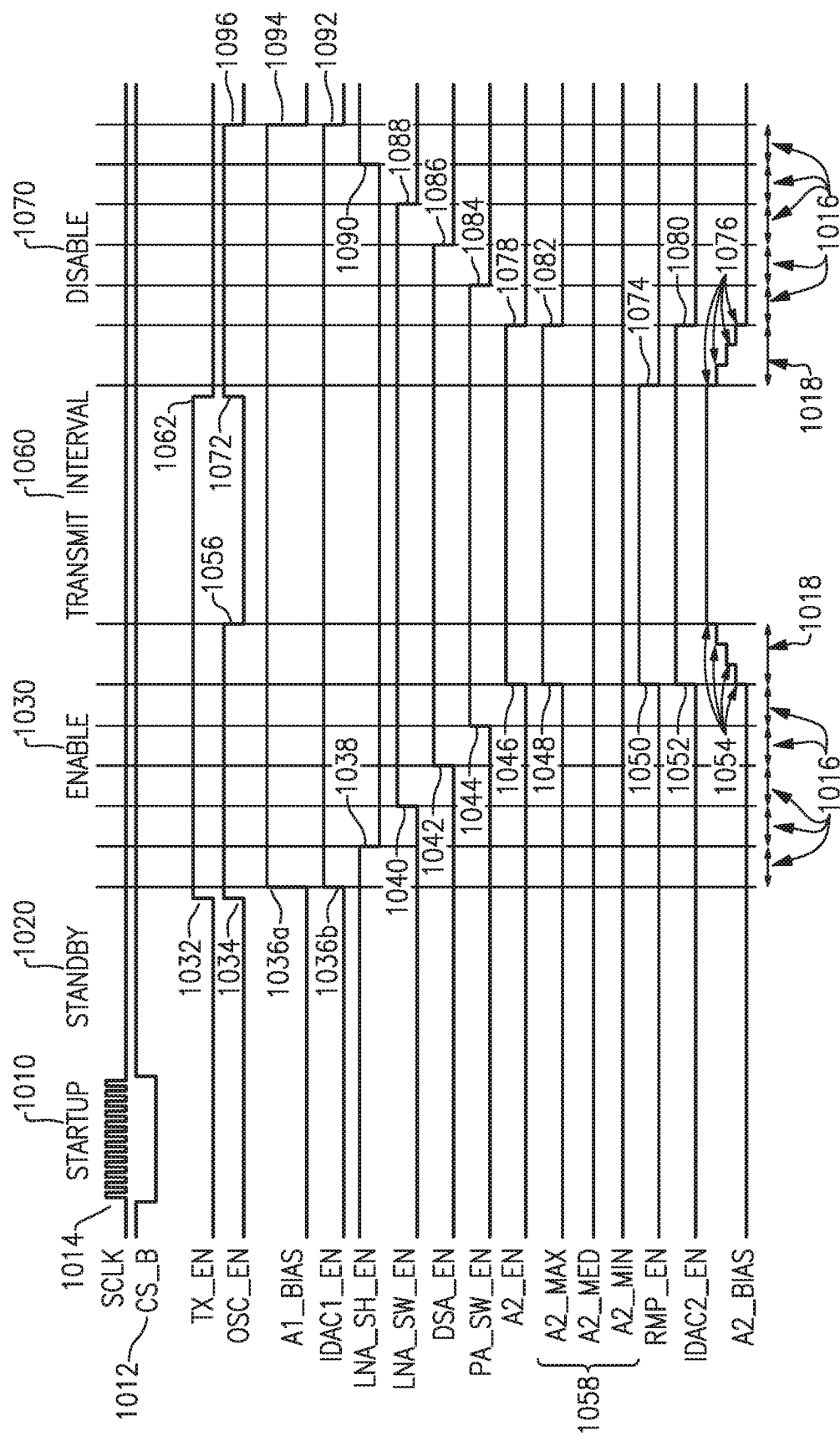

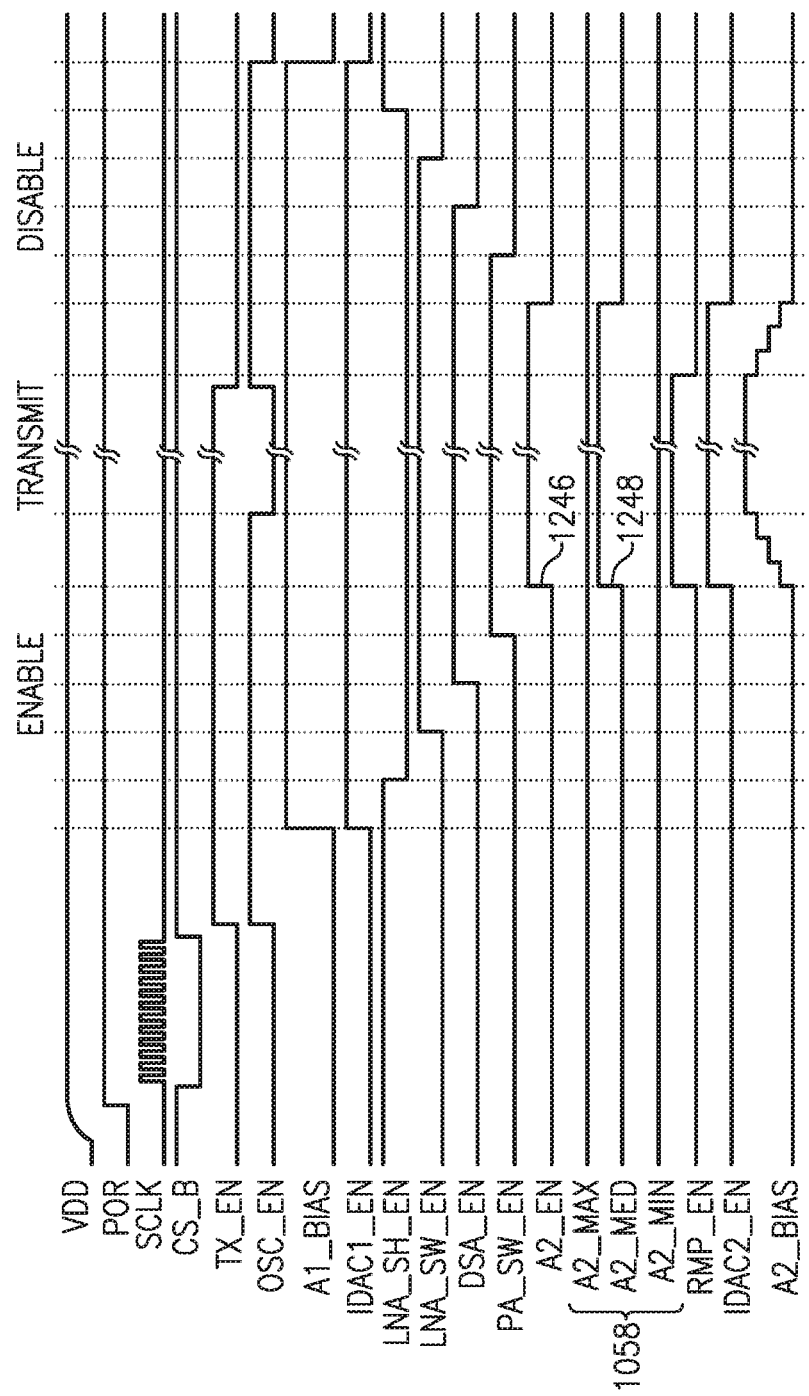

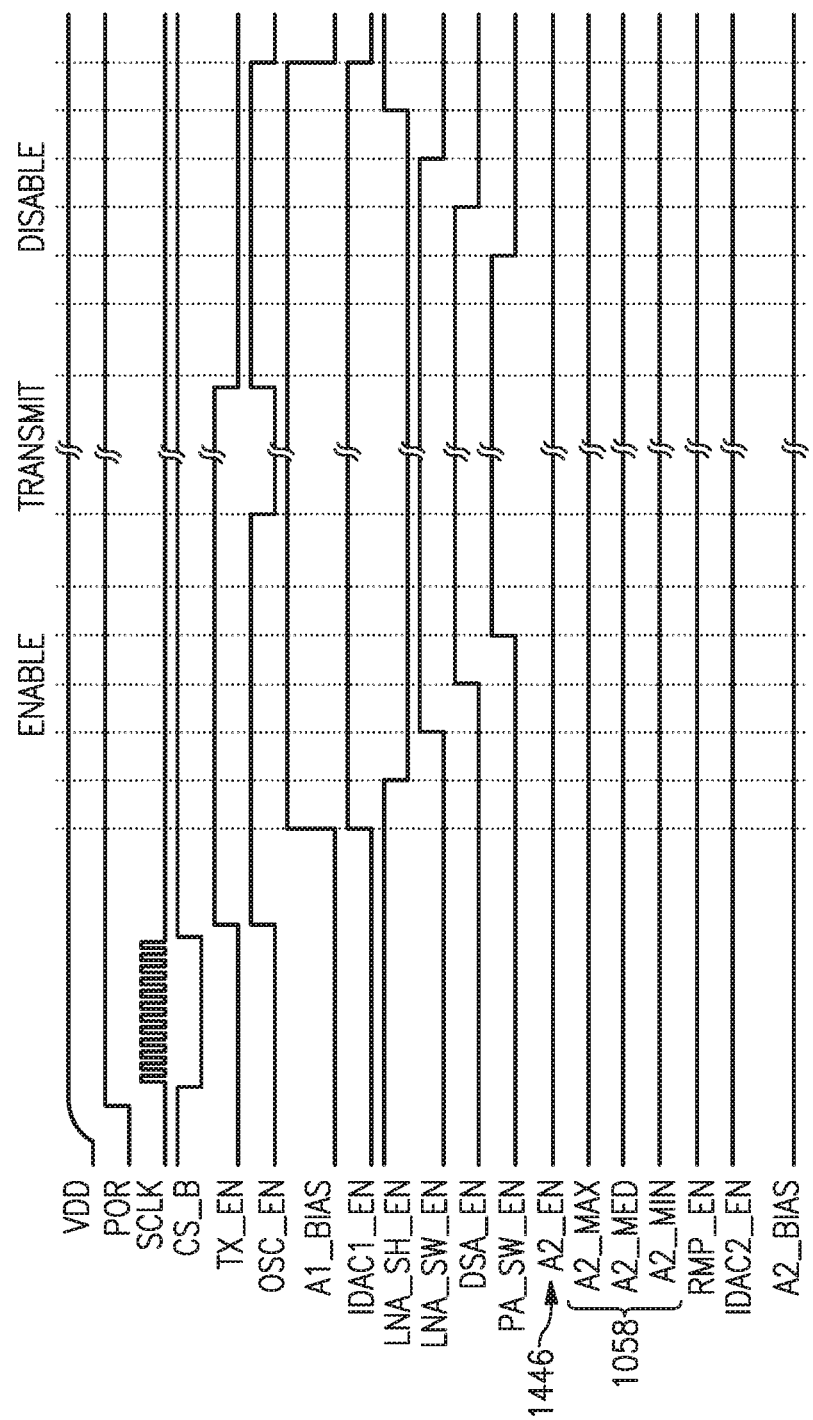

TRANSIENT OUTPUT SUPPRESSION IN AN AMPLIFIER

CROSS-REFERENCE TO RELATED APPLICATIONS

This application claims the benefit under 35 U.S.C. § 119(e) of U.S. Provisional Patent Application No. 62/420,907 titled TRANSIENT OUTPUT SUPPRESSION IN AN AMPLIFIER filed on Nov. 11, 2016.

This application further relates to U.S. patent application Ser. No. 15/808,486 filed on Nov. 9, 2017, and titled HIGH-LINEARITY VARIABLE GAIN AMPLIFIER WITH BYPASS PATH, which claims the benefit under 35 U.S.C. § 119(e) of U.S. Provisional Patent Application No. 62/420,326 titled HIGH-LINEARITY VARIABLE GAIN AMPLIFIER WITH BYPASS PATH filed on Nov. 10, 2016, each of which is herein incorporated by reference in its entirety for all purposes.

This application further relates to U.S. patent application Ser. No. 15/808,341 filed on even date herewith Nov. 9, 2017, and titled WIDE DYNAMIC RANGE AMPLIFIER SYSTEM, which claims the benefit under 35 U.S.C. § 119(e) of U.S. Provisional Patent Application No. 62/420,875 titled WIDE DYNAMIC RANGE AMPLIFIER SYSTEM filed on Nov. 11, 2016, each of which is herein incorporated by reference in its entirety for all purposes.

This application further relates to U.S. patent application Ser. No. 15/808,389 filed on Nov. 9, 2017, and titled AMPLIFIER SYSTEM WITH DIGITAL SWITCHED ATTENUATOR, which claims the benefit under 35 U.S.C. § 119(e) of U.S. Provisional Patent Application No. 62/420,681 titled AMPLIFIER SYSTEM WITH DIGITAL SWITCHED ATTENUATOR filed on Nov. 11, 2016, each of which is herein incorporated by reference in its entirety for all purposes.

This application further relates to U.S. patent application Ser. No. 15/808,358 filed on Nov. 9, 2017, and titled REDUCING IMPEDANCE DISCONTINUITIES ON A SHARED MEDIUM, which claims the benefit under 35 U.S.C. § 119(e) of U.S. Provisional Patent Application No. 62/421,084 titled REDUCING IMPEDANCE DISCONTINUITIES ON A SHARED MEDIUM filed on Nov. 11, 2016, each of which is herein incorporated by reference in its entirety for all purposes.

This application further relates to U.S. patent application Ser. No. 15/808,458 filed on Nov. 9, 2017, and titled TEMPERATURE COMPENSATED OSCILLATOR, which claims the benefit under 35 U.S.C. § 119(e) of U.S. Provisional Patent Application No. 62/420,806 titled TEMPERATURE COMPENSATED OSCILLATOR filed on Nov. 11, 2016, each of which is herein incorporated by reference in its entirety for all purposes.

BACKGROUND

Data Over Cable Service Interface Specifications (DOCSIS) are developed by CableLabs, a non-profit consortium of cable operators focused on technologies and specifications for delivery of data signals that carry information such as data, video, voice, or other information, and for delivery of additional next generation services. DOCSIS defines the signal parameters for communications transmissions over a cable service infrastructure.

Evolution in the cable industry, particularly in the cable television service, has resulted in the reduction or elimination of traditional analog television channels that previously utilized frequencies as low as 54 MHz in the United States. This has freed spectrum within the cable system infrastructure, and the progression of DOCSIS specifications has begun to incorporate more of this spectrum. DOCSIS 3.1, for example, specifies an upstream frequency range of 5 MHz up to 204 MHz, which is almost 2.5 times the frequency range supported by DOCSIS 3.0, covering more than five and a third octaves. Additionally, full compliance with DOCSIS 3.1 requires support for power output up to 65 dBmV into 75 Ohm loads across the entire spectrum. Conventional amplifiers for these systems have not met the demanding challenges of power output dynamic range across the wide spectrum range necessary for full compliance with DOCSIS 3.1 and anticipated future standards.

SUMMARY

Aspects and examples are directed to amplifier systems and components thereof, and to devices, modules, and systems incorporating the same. Amplifier systems and methods disclosed herein are capable of a high range of dynamic power output across a broad frequency spectrum. In some examples, a combination of amplification and attenuation components are applied to meet various challenges of maintaining linearity and noise output limits, among other criteria.

According to one aspect, a method of suppressing spurious emissions from an amplifier having a plurality of bias levels is provided and includes initiating a change in a level of a bias signal provided to the amplifier, and ramping the level of the bias signal from an initial bias level to a final bias level over a plurality of steps, the plurality of steps including at least one step in which the level of the bias signal is between the initial bias level and the final bias level.

In some embodiments, the initial bias level corresponds to a disabled state of the amplifier and the final bias level corresponds to an enabled state of the amplifier.

In some embodiments, the initial bias level corresponds to a state in which the amplifier provides a first amount of gain and the final bias level corresponds to a state in which the amplifier provides a second amount of gain, the second amount of gain being different than the first amount of gain. The first amount of gain may be less than the second amount of gain, or the first amount of gain may be more than the second amount of gain.

Certain embodiments also include determining a difference between the initial bias level and the final bias level and determining a number of steps in the plurality of steps based on the determined difference. Some embodiments may further include determining a period of time over which the level of the bias signal is to be ramped from the initial bias level to final bias level and determining the number of steps in the plurality of steps based on the determined difference and the determined period of time.

Some embodiments include determining a period of time over which the level of the bias signal is to be ramped from the initial bias level to final bias level.

Some embodiments include switchably coupling an output of the amplifier to an output terminal subsequent to ramping the level of the bias signal from the initial bias level to the final bias level. Certain embodiments further include switchably decoupling the output of the amplifier from the output terminal prior to ramping the level of the bias signal from the initial bias level to the final bias level over the plurality of steps.

According to another aspect, a method of suppressing spurious emissions from an amplifier having a plurality of bias levels is provided that includes initiating a change in a level of a bias signal provided to the amplifier, determining a difference between an initial bias level and a final bias level of the bias signal, and ramping the level of the bias signal from the initial bias level to the final bias level over a period of time that is based upon the difference between the initial bias level and the final bias level.

In some embodiments, the amplifier is coupled to an output terminal having an effective impedance, and the period of time is based upon the difference between the initial bias level and the final bias level and the effective impedance of the output terminal. The method may also include determining the effective impedance of the output terminal.

In some embodiments, the bias signal may be provided to the amplifier via a resistive-capacitive circuit, and the period of time is further based upon a time constant of the resistive-capacitive circuit. The resistive-capacitive circuit may be adjustable, the method further comprising adjusting the resistive-capacitive to adjust the time constant of the resistive-capacitive circuit.

Certain embodiments include switchably coupling an output of the amplifier to an output terminal subsequent to ramping the level of the bias signal from the initial bias level to the final bias level. Some embodiments may also include switchably decoupling the output of the amplifier from the output terminal prior to ramping the level of the bias signal from the initial bias level to the final bias level over the plurality of steps.

According to another aspect, a method of suppressing spurious emissions from an amplifier having a plurality of bias levels is provided that includes initiating a change in a level of a bias signal provided to the amplifier from a first bias level to a second bias level, determining whether a difference between the first bias level and the second bias level is greater than a threshold, and ramping the level of the bias signal from the first bias level to the second bias level over a plurality of steps in response to a determination that the difference between the first bias level and the second bias level is greater than the threshold.

According to another aspect, a method of reducing spurious emissions in a multi-stage amplifier assembly is provided that includes enabling a first stage of the multi-stage amplifier assembly, the first stage being an input amplifier stage, selectively coupling the first stage to a second stage of the multi-stage amplifier assembly, the second stage being an attenuator, selectively coupling the second stage to a third stage of the multi-stage amplifier assembly, the third stage being an output amplifier stage, enabling the third stage, and selectively coupling the third stage to a signal output terminal subsequent to performing all of the above.

According to another aspect, a method of reducing spurious emissions in a multi-stage amplifier assembly is provided that includes enabling a first stage of the multi-stage amplifier assembly, the first stage being an input amplifier stage, selectively coupling the first stage to a second stage of the multi-stage amplifier assembly, subsequent to enabling the first stage, the second stage being an attenuator, selectively coupling the second stage to a third stage of the multi-stage amplifier assembly, subsequent to coupling the first stage to the second stage, the third stage being an output amplifier stage, and enabling the third stage, subsequent to coupling the second stage to the third stage.

According to another aspect, a method of suppressing spurious emissions from an amplifier having a plurality of bias levels is provided that includes changing a level of a bias signal provided to the amplifier from an initial bias level to a final bias level, determining whether spurious emissions resulting from the changing level of the bias signal have subsided, and switchably connecting an output of the amplifier to an output terminal in response to the determination that the spurious emissions resulting from the changing level of the bias signal have subsided.

In some embodiments, the initial bias level corresponds to a disabled state of the amplifier and the final bias level corresponds to an enabled state of the amplifier.

In some embodiments, the initial bias level corresponds to a state in which the amplifier provides a first amount of gain and the final bias level corresponds to a state in which the amplifier provides a second amount of gain, the second amount of gain being different than the first amount of gain. The first amount of gain may be less than the second amount of gain, or the first amount of gain may be more than the second amount of gain.

Certain embodiments include switchably connecting the output terminal to a load prior to changing the level of the bias signal. The load may be a switchable attenuator, a terminating impedance, or a signal path different from the output of the amplifier. In embodiments where the load is a switchable attenuator, the method may include configuring the switchable attenuator into an isolation mode prior to switchably connecting the output terminal to the load, the isolation mode providing attenuation and a terminating impedance.

Still other aspects, examples, and advantages are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment. Various aspects and embodiments described herein may include means for performing any of the described methods or functions.

In the event of inconsistent usages of terms between this document and documents incorporated herein by reference, the term usage in the incorporated references is supplementary to that of this document; for irreconcilable inconsistencies, the term usage in this document controls.

BRIEF DESCRIPTION OF THE DRAWINGS

Various aspects of at least one example are discussed below with reference to the accompanying figures, which are not intended to be drawn to scale. The figures are included to provide illustration and a further understanding of the various aspects and examples, and are incorporated in and constitute a part of this specification, but are not intended as a definition of the limits of the invention. In the figures, identical or nearly identical components illustrated in various figures may be represented by like numerals. For purposes of clarity, not every component may be labeled in every figure. In the figures:

FIG. 8A is a schematic diagram of an example of a smoothing circuit;

FIG. 8B is a graph of a step signal;

FIG. 8C is a graph of a smoothed version of the step signal of FIG. 8B;

FIG. 10 is a timing diagram of an example of a set of control signals for an amplifier system;

FIGS. 12-14 are timing diagrams of an example of a set of control signals for an amplifier system.

DETAILED DESCRIPTION

Figure 1:
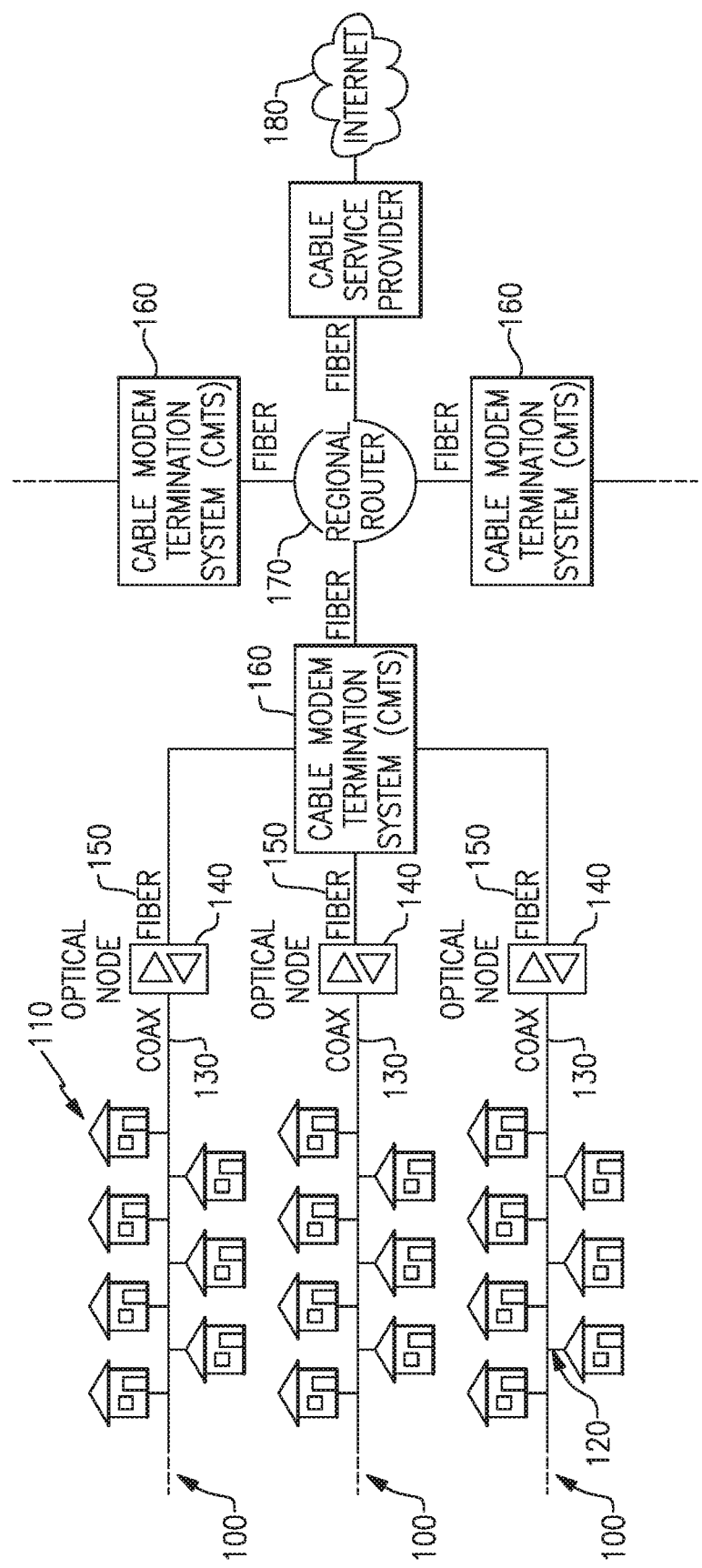
FIG. 1 is a schematic diagram of a data over cable services environment.

Aspects and examples are directed to amplifier systems and components thereof, and to devices, modules, and systems incorporating same.

It is to be appreciated that examples of the methods, systems, and apparatuses discussed herein are not limited in application to the details of construction and the arrangement of components set forth in the following description or illustrated in the accompanying drawings. The methods, systems, and apparatuses are capable of implementation in other examples and of being practiced or of being carried out in various ways. Examples of specific implementations are provided herein for illustrative purposes only and are not intended to be limiting. Examples disclosed herein may be combined with other examples in any manner consistent with at least one of the principles disclosed herein, and references to "an example," "some examples," "an alternate example," "various examples," "one example" or the like are not necessarily mutually exclusive and are intended to indicate that a particular feature, structure, or characteristic described may be included in at least one example. The appearances of such terms herein are not necessarily all referring to the same example. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

Among other things, DOCSIS defines signal parameters for communications transmissions over a cable service infrastructure. The DOCSIS 3.1 specification follows upon an earlier DOCSIS 3.0 specification and includes significant changes to the interface specification for Cable Modems (CM's) and for Cable Modem Termination Systems (CMTS's). In a system for data over cable service, multiple sites, or customer premises, are typically connected to a common waveguide medium, such as a coaxial cable, that terminates at a hub operated by a cable operator. Each of the customer premises has one or more cable modems that receive data signals from the hub in a downstream direction and transmit data signals to the hub in an upstream direction. A cable modem termination system is placed at the hub and receives the individual upstream data signals from the cable modems and transmits the downstream data signals. Every data signal transmission is received by all other stations, CM's or the CMTS, coupled to the common (i.e., shared) medium. The data signals, downstream and upstream, include addressing information identifying to which cable modem they pertain, and each cable modem on the common medium generally ignores data signals not intended for it.

The following discussion generally involves upstream transmission signals and equipment. The cable modems on a common medium receive instructions from the CMTS directing the cable modems as to signal formatting and transmission parameters each cable modem is to use for its upstream transmissions. In particular, once associated with the network, each cable modem only transmits upstream data signals when capacity on the shared medium is assigned, or allocated, to it by the CMTS. DOCSIS 3.0 standardized upstream transmissions by the cable modems in two potential modes, TDMA mode and S-CDMA mode. Each mode includes frequency and time slot allocations to the cable modems, i.e., Frequency Division Multiple Access (FDMA) and Time Division Multiple Access (TDMA). The CMTS communicates frequency and time allocations in a particular Media Access Control (MAC) Management Message known as a bandwidth allocation map (MAP) message. Time allocations are given in mini-slots that are an integer multiple of 6.25 microseconds ($\mu S$). Modulation to be used by the cable modem is also assigned by the CMTS and is communicated in an Upstream Channel Descriptor (UCD) of a MAC Management Message. The fundamental upstream modulation scheme is quadrature amplitude modulation (QAM) with a constellation size up to 128, and the coding scheme includes Reed-Solomon (R-S) Forward Error Correction (FEC) coding, also with Trellis Coded Modulation (TCM) in North America. The S-CDMA mode further incorporates Synchronous Code Division Multiple Access (S-CDMA) as part of the modulation scheme.

According to DOCSIS 3.0, the spectrum available for allocation to upstream transmissions is from 5 MHz up to 85 MHz, just over four octaves. Depending upon the number of channels allocated, a cable modem must support a data signal transmission burst with power output (to a 75 Ohm medium, e.g., coaxial cable) per channel up to 53 dBmV or 56 dBmV in S-CDMA mode, and possibly up to 61 dBmV in TDMA mode. Power output from each cable modem is also controlled by the CMTS. In a process called ranging, the CMTS instructs each cable modem to increase or decrease transmission power such that upstream data signals arriving at the CMTS arrive with substantially the same signal levels regardless of which cable modem sent the signals. Cable modems that are further away from the CMTS on the shared medium may need to transmit with higher power to compensate for additional attenuation associated with a physically longer propagation along the length of the cable. Cable modems closer to the CMTS, along the shared medium, may need to transmit with lower power because their signals travel a shorter distance along the cable, causing less attenuation.

Evolution in the cable industry has freed spectrum within the cable system infrastructure, and the progression of DOCSIS specifications has begun to incorporate more of this spectrum. DOCSIS 3.1, for example, specifies an upstream frequency range of 5 MHz up to 204 MHz, which is almost 2.5 times the frequency range supported by DOCSIS 3.0, covering more than five and a third octaves. In addition to the extended frequency ranges and accordingly expanded bandwidths, DOCSIS 3.1 brings new modulation and coding schemes into the cable data services industry. DOCSIS 3.1 implements orthogonal frequency division multiple access (OFDMA) into the upstream channels, and allows allocation by the CMTS to the CM of a frequency range, rather than individual channels, and within the frequency range there are multiple subcarriers of either 25 kHz or 50 kHz spacing. To allow for backwards compatibility, a CMTS may continue to allocate channels within DOCSIS 3.0 frequency ranges, modulation, and coding schemes. Additionally, full compliance with DOCSIS 3.1 requires support for power output up to 65 dBmV into 75 Ohm loads across the entire spectrum. Cable modem manufacturers may further require higher output signal levels, of, for example, 68 dBmV or higher.

The DOCSIS 3.1 specification also has strict requirements for Noise Figure (NF), Modulation error ratio (MER) and spurious emissions across the entire spectrum. Conventional cable modems have not been able to meet the DOCSIS 3.1 specifications over the full 5-204 MHz spectrum and have instead implemented only the newer modulation scheme of the DOCSIS 3.1 specification over a conventional spectrum range of up to 42 MHz or up to 85 MHz. In the near future, however, demand will increase to the point that cable modem manufacturers will be required to support the full spectrum of the DOCSIS 3.1 specification from 5-204 MHz.

In addition to the requirement to support power output up to 65 dBmV into 75 Ohm loads across the entire upstream spectrum from 5-204 MHz with accompanying noise figure, modulation error ratio, and spurious emissions limitations, a cable modem also must be capable of adjusting upstream output power to accommodate ranging operations of the CMTS, i.e., to adjust output power as instructed by the CMTS such that the data signals received at the CMTS from all cable modems in the system arrive with substantially the same power. A typical cable modem may provide an output power adjustable in 1 dB steps from about 5 dBmV up to about 64 dBmV, with various noise figure, modulation error ratio, and spurious emission limits, across the DOCSIS 3.0 spectrum with a high end frequency of 42 MHz or 85 MHz. As described above, DOCSIS 3.1 more than doubles this high end frequency to 204 MHz, while maintaining the lower edge of 5 MHz, with similarly stringent noise figure, modulation error ratio, and spurious emission limits.

Radio Frequency (RF) power amplifier manufacturers for the cable modem industry are challenged to design amplifiers capable of providing adjustable signal output powers spanning 58 dB or more (e.g., 10-68 dBmV at 75 Ohms) across a frequency band spanning more than 5 octaves (e.g., 5-204 MHz), while maintaining stringent noise figure and modulation error ratio requirements across all output signal levels and frequencies. Additionally, at least because cable modems connect to a shared medium, they are desired to behave well in other aspects, such as to present a consistent impedance to the cable to reduce signal reflections, and to limit spurious emissions.

Each of various frequency spectrum allocations made under DOCSIS 3.0 and 3.1 specifies at least one pair of low and high edge frequencies for a transmit range and for a receive range. The terms transmit and receive as used herein are from the perspective of a cable modem. That is, a transmit frequency range is an upstream range, for data signals sent from a cable modem (CM) to a cable modem termination system (CMTS), and a receive frequency range is a downstream range, for data signals sent from the CMTS to one or more CM's.

FIG. 1 is a schematic diagram for data over cable service in a residential environment implemented with a hybrid fiber-coax infrastructure. Shown in FIG. 1 are three distribution branches 100 serving multiple houses, or customer premises 110, each connected by at least one drop 120 from one of the distribution branches 100. Each customer premises 110 has a cable modem connected to a coaxial cable. Customer premises 110 that are connected via the same distribution branch 100 share a coaxial medium 130 in the neighborhood, such that all data signal transmissions on the shared coaxial medium 130 may be observed at, and may have an impact upon, other cable modems connected to the shared coaxial medium 130. In a hybrid fiber-coax system like that shown in FIG. 1, each distribution branch 100 coaxial medium 130 connects to an optical node 140 that converts radio frequency (RF) electrical signals from the coaxial medium 130 to optical signals on a fiber optic cable 150, and vice versa. The fiber optic cable 150 delivers the optical signals to a cable modem termination system (CMTS) 160. For purposes of the disclosure herein, the cable modems may be considered to communicate directly with the CMTS 160 via electrical radio frequency signals on the coaxial medium 130. Beyond the CMTS 160, and as shown for example in FIG. 1, the CMTS 160 may communicate with a regional router 170 and ultimately to a further network 180. Other examples of data over cable services may include other equipment and may provide services to commercial rather than residential customer premises.

Figure 2:
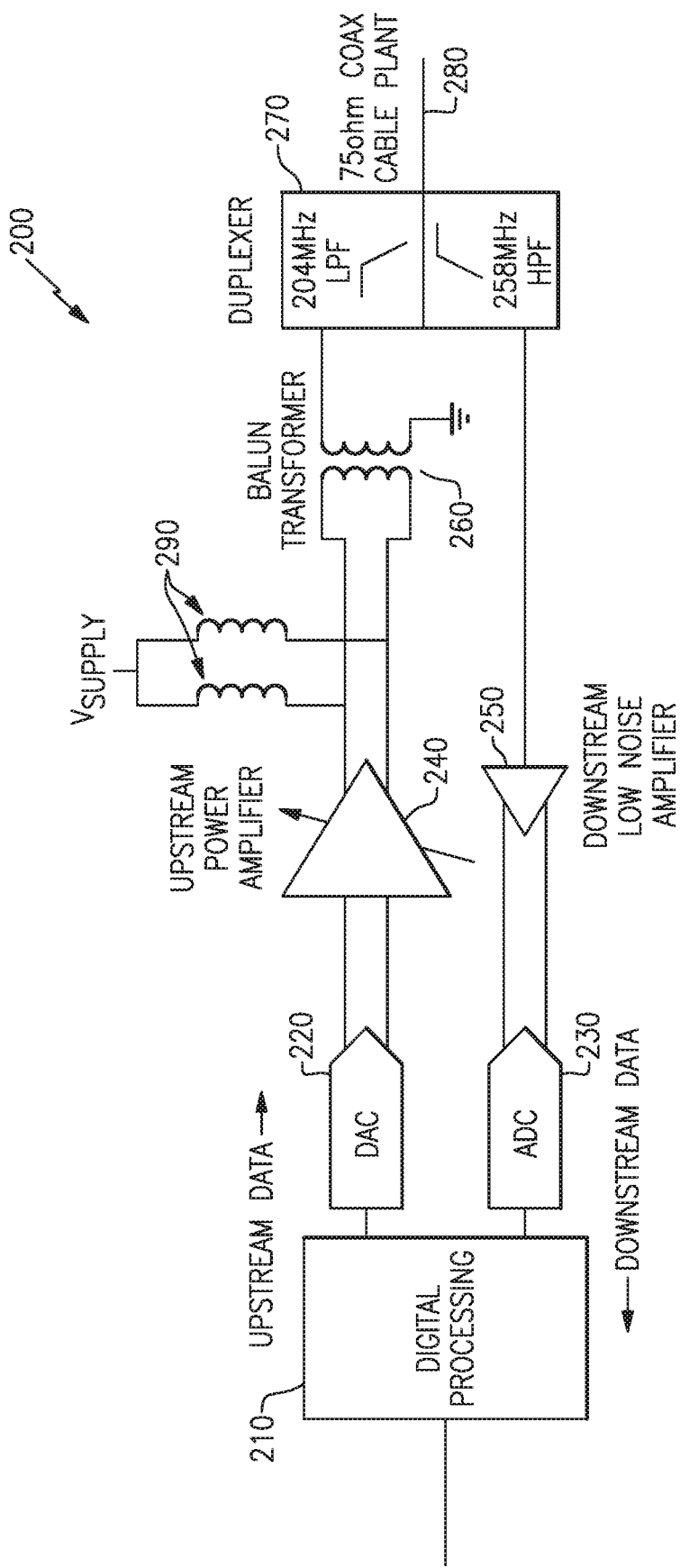
FIG. 2 is a schematic diagram of a cable modem.

FIG. 2 is a simplified schematic diagram of an example of a cable modem. The cable modem 200 transmits upstream data signals to a CMTS 160 (see FIG. 1) and receives downstream data signals from the CMTS 160. The cable modem 200 includes a signal processor 210 that processes received downstream data signals and generates upstream data signals for transmission. The signal processor 210 may operate in a digital domain and the cable modem 200 may further include a digital to analog converter (DAC) 220 that converts the upstream signals into an analog form, and an analog to digital converter (ADC) 230 that converts the downstream signals into digital form. An upstream amplifier 240 amplifies the upstream data signals to a power level sufficient for the upstream data signals to reach the CMTS with enough signal strength for the CMTS to reliably receive the upstream data signals. A downstream amplifier 250 amplifies received downstream data signals (from the CMTS) to a sufficient level for the signal processor 210 to reliably receive the downstream data signals. It should be appreciated that, for clarity, additional circuitry may be included that is not shown, such as up-converters for the transmit side and down-converters for the receive side, for example. The downstream amplifier 250 is typically a low noise amplifier (LNA) configured to sufficiently amplify the relatively low signal level of the received downstream data signal without adding significant noise. The output of the upstream amplifier 240 is coupled through a balun 260 to a duplexer 270 that couples the upstream data signals to a coaxial cable 280, which is further operatively coupled to a shared coaxial medium 130 of FIG. 1. The duplexer 270 also couples the downstream data signals from the coaxial cable 280 to provide the downstream data signals to the downstream amplifier 250. The duplexer 270 may include frequency selective filters to separate the downstream data signals arriving via the coaxial cable 280 from the upstream data signals being provided to the coaxial cable 280. As shown in FIG. 2, the upstream amplifier 240 may be implemented as a differential amplifier having differential inputs (e.g., each of a positive and a negative input, or two inputs accommodating a magnitude difference) and having a differential output (e.g., each of a positive and a negative output, or two outputs providing a magnitude difference). Additionally as shown in FIG. 2, the differential sides of one or more internal components of the upstream amplifier 240 may be coupled to a power supply voltage by each of a pair of electrical elements, for example, inductors 290.

According to aspects disclosed herein, the cable modem 200 supports the full upstream frequency range of DOCSIS 3.1 from 5 MHz up to 204 MHz with selectable output signal power controlled in multiple steps. In at least one embodiment, the cable modem 200 and the upstream amplifier 240 support output signal power up to 68 dBmV into a 75 Ohm coaxial cable with at least fifty nine (59) output signal power settings differing by a nominal 1 dB variation between adjacent settings. In some embodiments, the upstream amplifier 240 may include a multi-chip module including a substrate with one or more die to implement various features of the upstream amplifier 240. In some embodiments the upstream amplifier 240 may be included in a module that also includes the downstream amplifier 250.

In some embodiments, the upstream amplifier 240 may provide a combination of amplification and attenuation to provide a plurality of distinct output signal power settings. In one example, the number of output signal power settings is fifty-nine. For example, the output signal power settings may span from a minimum output signal power of 10 dBmV up to 68 dBmV, selectable in nominal 1 dB increments, for example, or may span other output signal powers or may provide alternate selectable increments. In at least one embodiment, the upstream amplifier 240 provides a gain range of −23 dB to +35 dB.

An amplifier, such as the upstream amplifier 240, may be formed as an assembly, e.g., an amplifier assembly, of one or more stages having various functions and may include control components, e.g., a controller, that controls aspects of the stages and may have a communication interface to receive configuration parameters and instructions. The terms amplifier, amplifier assembly, and amplifier system may at times be used interchangeably herein and generally refer to one or more stages coupled to receive an input signal and to provide an output signal varying in signal level or power level. The terms amplifier, amplifier assembly, and amplifier system may at times refer to objects that include control components in combination with the one or more stages.

Figure 3:
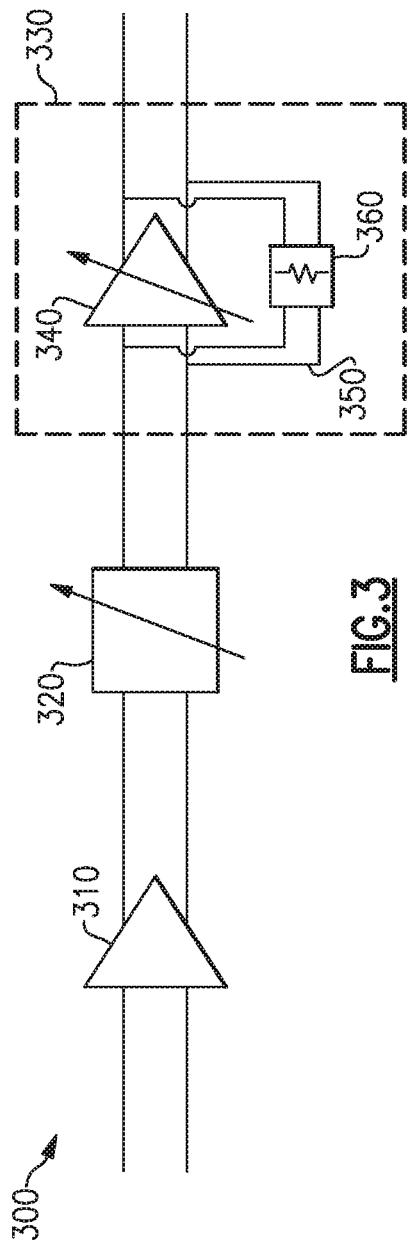
FIG. 3 is a schematic diagram of an example of an amplifier system.

FIG. 3 illustrates an amplifier system 300 that is an amplifier assembly including an input stage 310, an adjustable attenuator 320, and an output stage 330. The input stage 310 may include a fixed gain amplifier, which may be a low noise amplifier (LNA). The adjustable attenuator 320 may have a range of selectable attenuation levels that may include a 0 dB attenuation level such that, when selected, the adjustable attenuator 320 passes signals from its input to its output substantially without attenuation, and the adjustable attenuator 320 may provide levels of attenuation in, for example, 1 dB steps, up to a maximum attenuation, such as 34 dB of attenuation, for example.

The output stage 330 is an adjustable gain element (e.g., variable gain amplifier circuit) including a variable gain amplifier 340 and a bypass path 350. The bypass path 350 may include a fixed attenuator 360. The variable gain amplifier 340 and the bypass path 350, each part of the output stage 330, may be alternatively selected to provide an adjustable gain from, for example, −4 dB up to 20 dB, thus providing a 24 dB range of selectable gain settings. With such an output stage 330, in combination with the adjustable attenuator 320 that may provide a 35 dB range, the amplifier system 300 provides a 59 dB range of overall gain variability.

In at least one embodiment, the input stage 310 provides a fixed 15 dB gain, the adjustable attenuator 320 is a digital switched attenuator (DSA) that provides a range of attenuation from 0 to 34 dB in nominal 1 dB increments, the fixed attenuator 360 is a loss pad that provides 4 dB of attenuation, and the variable gain amplifier 340 provides a selectable gain of 4, 12, or 20 dB by enabling a varying number of amplifier elements as discussed in more detail below. The amplifier and attenuator components may be designed and constructed to provide any set of amplification gain and/or attenuation values, and embodiments described herein are not limited to the specific examples of gain and attenuation values or ranges described. Additionally, embodiments of an amplifier system may include additional bypass path circuitry providing different attenuation values or no attenuation, e.g., the bypass path 350 may not have a fixed attenuator 360 and instead may pass a signal substantially without attenuation, or there may be no bypass path 350. Additionally, the variable gain amplifier 340 may provide alternate gain values, including negative gain values, and may provide higher or lower gain values than those explicitly described herein, and may provide more or fewer than three amplify modes as described herein, in any combination to provide variable output signal levels to accommodate varying applications and operational requirements.

Continuing with the particular above-described embodiment, examples of operating states are described that provide for gain settings ranging from a minimum net gain of −23 dB up to a maximum net gain of +35 dB. The minimum net gain of the amplifier system 300 is provided when the adjustable attenuator 320 is set to provide maximum attenuation (34 dB in this example) and the output stage 330 is configured to route a signal through the bypass path 350 that includes the fixed attenuator 360. The resulting net gain of −23 dB is the combination of 15 dB gain of the input stage 310, −34 dB gain of the adjustable attenuator 320, and −4 dB gain of the fixed attenuator 360.

The maximum net gain of the amplifier system 300 is provided when the adjustable attenuator 320 is set to provide 0 dB of attenuation and the output stage 330 is configured to route a signal through the variable gain amplifier 340 set to provide 20 dB of gain. The resulting net gain of +35 dB is the combination of 15 dB gain of the input stage 310 and 20 dB gain of the variable gain amplifier 340. The adjustable attenuator 320 passes a signal without attenuation (0 dB) when the amplifier system 300 is in a maximum gain operating state. For clarity, the gain settings of the input stage 310, the adjustable attenuator 320, and the output stage 330 are shown in Table 1 for the minimum and maximum net gain operating states of this example of the amplifier system 300.

TABLE 1

| Input Stage 310 | Attenuator 320 | Output Stage 330 | Net Gain |
|---|---|---|---|
| +15 dB | −34 dB | −4 dB | −23 dB |
| +15 dB | 0 dB | +20 dB | +35 dB |

Intermediate gain values, between the minimum and maximum net gain of the amplifier system 300 overall, e.g., gain values between −23 dB and +35 dB in the example discussed above, may be achieved by varying combinations of gain settings for the adjustable attenuator 320 and the output stage 330.

In combination, the bypass path 350 having a fixed attenuator 360 and the variable gain amplifier 340 having three gain states, result in four modes of operation for output stage 330. In a first mode, which is a bypass mode, a signal is routed through the bypass path 350 and not routed through the variable gain amplifier 340. In this mode the signal travels through the fixed attenuator 360, resulting in a 4 dB attenuation applied by the output stage 330, for example. In addition to the bypass mode, there are three amplify modes wherein the signal is routed through the variable gain amplifier 340 and not routed through the bypass path 350. In each of the amplify modes, the signal is routed through the variable gain amplifier 340 that applies a respective gain to the signal. In one example of the amplifier system 300 discussed above, in the first amplify mode the variable gain amplifier 340 applies a 4 dB gain to the signal, in the second amplify mode the variable gain amplifier 340 applies a 12 dB gain to the signal, and in the third amplify mode the variable gain amplifier 340 applies a 20 dB gain to the signal.

Figure 4:
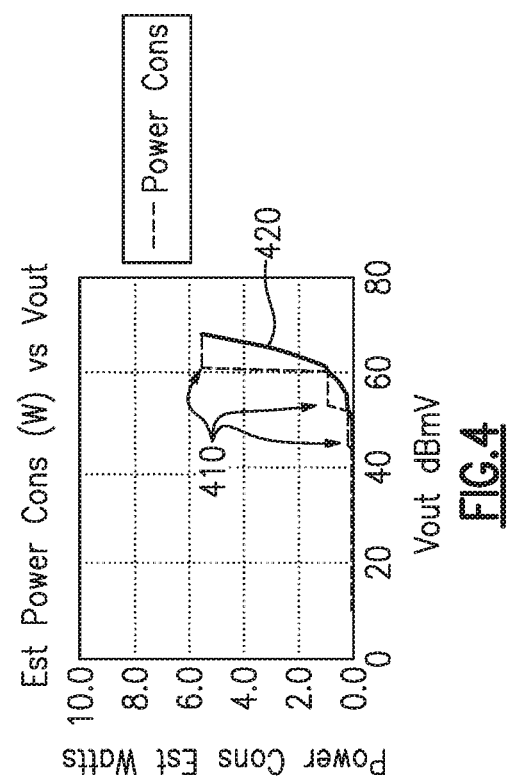
FIG. 4 is a graph of estimated power consumption for an amplifier system.

FIG. 4 is a graph of estimated power consumption versus output signal levels. The steps 410 on this graph represent increasing power requirements, from left to right, of the variable gain amplifier 340 as the output stage 330 mode changes from the bypass mode, to the first, second, and third amplify modes, respectively.

As shown in FIG. 4, the amplifier system 300 has reduced power requirements at lower output signal levels. At least in part, power reductions are achieved for lower desired output signal levels by reducing amplification of the variable gain amplifier 340, which is accomplished by disabling one or more unit cells of semiconductors, transistors, or other amplifier elements when the desired output signal level is relatively low, as discussed in more detail below. In some embodiments, power consumption is further reduced by adjusting an amplifier bias signal, which may be a bias current or a bias voltage, to increase efficiency.

The variable gain amplifier 340 may be coupled to a power supply that may provide source power to the variable gain amplifier 340 in the form of a bias current, which ultimately provides the power of the output signal provided by the variable gain amplifier 340. The bias current provided to the variable gain amplifier 340 may be varied based on the needs of the variable gain amplifier 340 for a particular output level setting of the amplifier system 300. For example, the first, second, and third amplify modes of the variable gain amplifier 340 may not each require the same amount of bias current to provide the first, second, and third amplification gains, for example, 4 dB, 12 dB, and 20 dB. Further efficiency may be achieved, in some embodiments, by adjusting the bias current for a particular amplification gain based upon the particular output level setting. For example, the third amplify mode of the variable gain amplifier 340 may be utilized to provide eight distinct output power levels. While there are eight such settings, for example, in which the variable gain amplifier 340 provides a gain of 20 dB, the bias signal provided to the variable gain amplifier 340 may be adjusted for each of the eight settings, to result in more efficient power consumption, based upon a desired output power level setting being achieved by varying the adjustable attenuator 320, which reduces the signal level at the input of the variable gain amplifier 340.

For a selected output signal level, and in at least one embodiment, an amplifier bias signal may be determined that provides enough power to the variable gain amplifier 340 to provide the desired output signal level with sufficient linearity and/or noise characteristics without providing additional power beyond that required. An amplifier bias signal determined necessary for a particular output signal level may be lower than an amplifier bias signal determined necessary for a different output signal level, even for the same gain characteristic of an amplify mode of the variable gain amplifier 340. Each determined value of bias current, e.g., for different desired output signal levels, may be recorded in a storage element, such as a lookup table, a register, or similar, and retrieved by a controller, for example, to control the bias current provided for each output signal level setting. In the example of the amplifier system 300 discussed above, there are a range of amplification and output signal levels for which a transmit signal is routed through the variable gain amplifier 340. When the transmit signal is routed through the variable gain amplifier 340, the variable gain amplifier 340 operates in one of the first, second, or third amplify modes to provide a gain of 4 dB, 12 dB, or 20 dB, respectively. Within any of these three amplify modes, the bias current provided to the variable gain amplifier 340 may be controlled or varied to optimize power consumption for varying output signal levels, thereby reducing power consumption between amplify modes.

FIG. 4 includes a smooth curve 420 that incorporates an adjusted bias current for each net gain, e.g., for differing output signal level settings. The dashed line plotted in FIG. 4 illustrates power consumption of the amplifier system 300 if a bias current is provided at a maximum amount for each amplify mode, and the solid curve plotted in FIG. 4 is the adjusted power consumption when an adjusted bias current is incorporated as discussed above. It is to be appreciated that while the example of the amplifier system 300 discussed above includes three amplify modes, each of which is used to provide a set of eight overall gain values, and accordingly a set of eight output signal levels, this is merely an example of one set of such values. Other embodiments of an amplifier system in accord with aspects and embodiments described herein may include more or fewer amplify modes with more or fewer gain settings, and various gain values and output signal levels may be provided by one or more amplify or bypass modes.

An amplifier system in accord with aspects and embodiments described herein may be implemented in a number of physical technologies and topologies. An amplifier system may include an input stage amplifier, an adjustable attenuator, a variable gain amplifier, and a bypass path signal path, or any combination or subset of these, implemented in various arrangements and manufactured from various techniques. Any of these components may be implemented in a substrate or in a die and may be designed for and manufactured from various semiconductor materials, such as Silicon (Si), Germanium (Ge), Gallium arsenide (GaAs), for example, using various design technologies, such as complementary metal-oxide semiconductor (CMOS), Silicon on insulator (SOI), double-diffused metal-oxide semiconductor (DMOS), laterally diffused metal-oxide semiconductor (LDMOS), bipolar CMOS/DMOS (BCD), pseudomorphic high-electron-mobility transistor (pHEMT), enhancement/depletion mode (E/D-mode) pHEMT, or various combinations of these or other materials and technologies.

In at least one embodiment, an amplifier system may include a fixed gain amplifier implemented on a GaAs ED-pHEMT die, a digital switched attenuator (DSA) implemented on an SOI die, a variable gain amplifier implemented on a BCD-LDMOS die, and a controller implemented on a bulk CMOS die. Each of the dies may be mounted upon or coupled to a substrate with interconnections to each other within the substrate, or by other conducting materials, to convey signals between the various inputs, outputs, and controlled elements of each die, and the set of dies on the substrate may be packaged into a multi-chip module (MCM) with a physical format suitable for incorporation into a device, such as a cable modem, by, for example, mounting and/or soldering to a circuit board.

Figure 5:
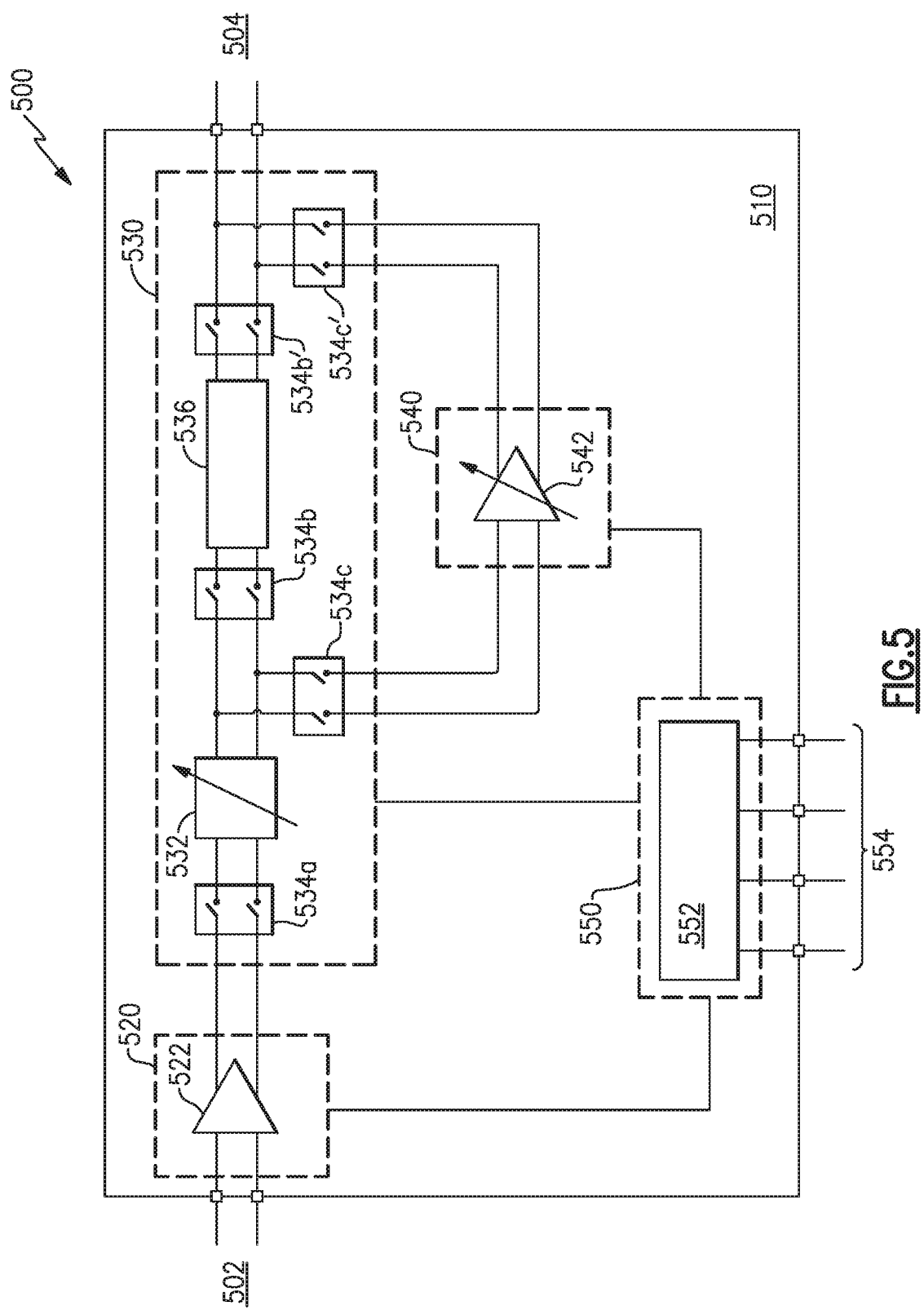
FIG. 5 is a schematic diagram of another example of an amplifier system.

FIG. 5 shows an example of an amplifier system 500, similar in manner to the amplifier system 300 described above with respect to FIG. 3, implemented as a multi-chip module. The amplifier system 500 has an input 502 for receiving balanced differential transmit signals and an output 504 for providing balanced differential transmit signals of differing signal levels. The amplifier system 500 includes multiple chip dies, as described individually in more detail below, provided on a substrate 510. A first die 520 is coupled to the input 502 and includes a fixed gain amplifier 522, such as the fixed gain amplifier of the input stage 310 of FIG. 3. A second die 530 is coupled to the output of the fixed gain amplifier 522 and includes a switch 534a that selectively couples the output of the fixed gain amplifier 522 to an adjustable digital switched attenuator 532 (such as the adjustable attenuator 320 of FIG. 3), and switches 534b, 534c that selectively route the transmit signal from the output of the digital switched attenuator 532 to either of a fixed attenuator 536 (such as the fixed attenuator 360 of FIG. 3), which may be a loss pad, in a bypass mode, or to a third die 540 that includes a variable gain amplifier 542 (such as the variable gain amplifier 340 of FIG. 3), in an amplify mode.

The switches 534 may be multiple switches as shown or may be fewer switches implemented with, e.g., single-pole double-throw switches that alternately make a connection to one or another signal path. In some embodiments, some of the switches 534 may be configured to enable a signal path upon receiving a particular control signal and others of the switches 534 may be configured to disable a signal path upon receiving a similar control signal. In some embodiments, inverters may be provided such that a single control signal may cause some of the switches 534 to enable a signal path and cause others of the switches 534 to disable a signal path. The switches 534 may be implemented as transistors or any suitable technology.

The amplifier system 500 also includes a fourth die 550 that includes a system controller 552 that provides control signals to components included on one or more of the first, second, and third dies. For example, the system controller 552 may communicate with or control the attenuation settings of the digital switched attenuator 532, control amplify modes and gain values of the variable gain amplifier 542, control or adjust a bias level (e.g., current or voltage) provided to the variable gain amplifier 542 or the fixed gain amplifier 522, and control the switches 534 to place the output stage in bypass mode or amplify mode and to establish the overall net gain of the amplifier system 500. The system controller 552 may control the various components based upon instructions it receives via a control interface 554. The amplifier system 500 may have, for example, the specifications described in Table 2.

TABLE 2

| | |
|---|---|
| Frequency Range | 5 MHz to 204 MHz |
| Input Stage | Fixed Gain Amplifier (e.g., Low Noise Amplifier) |
| | Gain: 15 dB (fixed) |
| | Noise Figure: 1 dB |
| | Input IP3: 15 dBm |
| | Output IP3: 30 dBm |

TABLE 2-continued

| | |
|---|---|
| Adjustable Attenuator | Selectable 0-34 dB attenuation in 1 dB steps |
| Output Stage | Variable Gain Amplifier |
| | Gain: 4, 12, 20 dB (selectable) |
| | Noise Figure: 10, 9, 8 dBm |
| | Input IP3: 30 dBm (all gain settings) |
| | Output IP3: 34, 42, 50 dBm |
| | Bypass Path |
| | 4 dB Loss Pad |

An amplifier system, such as the example of the amplifier system 500, may be provided in the form of a multi-chip module (as described above) to provide amplification of a signal in a first direction. The multi-chip module may also include additional amplifier components for amplification of a signal in a second direction. For example, at least one embodiment includes a multi-chip module having a first input and output for a transmit signal and having a second input and output for a receive signal. The multi-chip module may include an amplifier system to amplify a transmit signal from the first input and provide an amplified transmit signal to the first output, and may also include a receive signal amplifier, such as the low noise amplifier 250 illustrated in FIG. 2, to amplify a receive signal from the second input to provide an amplified receive signal at the second output. With respect to FIG. 5, in at least one embodiment, the first die 520 is implemented with GaAs ED-pHEMT technology, the second die 530 is implemented with SOI technology, the third die 540 is implemented with BCD-LDMOS technology, and the fourth die 550 is implemented with CMOS technology.

In at least one embodiment, an amplifier system may be provided as a packaged multi-chip module, with packaging such as an overmold that substantially encapsulates a substrate and various dies and components thereon, and including connectivity to the exterior of the packaging to provide signal and control interconnections. An amplifier system in accord with aspects and embodiments described herein may be provided on a single chip or die and may be packaged into a chip-scale package. Any of an amplifier system, multi-chip module, or chip-scale package as described herein may be used as an upstream amplifier for, e.g., a DOCSIS cable modem, or as a selectable-gain signal amplifier for any suitable application, such as a radio frequency amplifier or part of a front-end module. Component characteristics may be altered to provide an amplifier system in accord with aspects and embodiments described herein to provide amplification across a number of frequency ranges, gain values, output levels, linearity, noise characteristics, and other performance criterion to be suitable for various applications and changing operational parameters.

Referring again to FIG. 5, the system controller 552 provides control signals to various components of amplifier systems as described herein. For example, a controller may provide control signals to control attenuation settings, gain settings, signal routing switches, power supply (e.g., bias) settings, and other components to establish operational characteristics of an amplifier system. A controller, such as the system controller 552, may establish operational characteristics of the amplifier system in response to commands from another device or component, such as the signal processor 210 of FIG. 2. Accordingly, such a controller may have a control interface, such as the control interface 554. Additionally, a controller may control the timing of changes applied to various components to prevent or reduce conflicts, electrical shorts, spurious emissions, signal transients, disallowed or undesirable states, or changes in input or output impedances, and the like. Examples of a control interface 554 include, but are not limited to, a serial peripheral interface (SPI) or serial data interface (SDI), general purpose input/output (GPIO), mobile industry processor interface (MIPI), or the like. Additionally, the controller may control the various components of the amplifier system via direct or indirect control lines or via similar communication interfaces to those described above coupled to other controllers associated with the component being controlled. For example, an adjustable digital switched attenuator may have its own controller in communication with the amplifier system controller and/or a variable gain amplifier may have its own controller in communication with the amplifier system controller.

With reference to FIG. 5, as described above, a controller such as the system controller 552 may control various components in a manner to prevent or reduce spurious emissions. Signal transients occurring within any of the components of an amplifier system, such as the amplifier system 500 of FIG. 5, may cause spurious emissions at the output 504 that can interfere with other users of a shared medium, such as the coaxial medium 130 of FIG. 1. For this reason, it is desirable to limit spurious emissions and/or signal transients that are not part of a purposeful data signal transmission. Interface specifications and standards sometimes require that spurious emissions remain below certain threshold values. In some cases, amplifiers are enabled just prior to a data signal transmission and, accordingly, the method of turning on and coupling stages of an amplifier system, e.g., in preparation for a data signal transmission, may cause transients that could, if allowed, generate spurious emissions at the output of the amplifier system. Aspects and embodiments disclosed herein incorporate one or more components and methodologies to suppress transients occurring in the amplifier system and to reduce spurious emissions at the output, e.g., the output 504, that may be caused by transients.

In the case of the amplifier system 500, and as discussed above, an amplifier bias, such as a bias current or a bias voltage, may be provided to the fixed gain amplifier 522 and to the variable gain amplifier 542. In embodiments, there is a first bias input to receive an amplifier bias source for the fixed gain amplifier 522 and a second bias input to receive an amplifier bias source for the variable gain amplifier 542. In other embodiments there may be a single bias input and/or bias sources may be internal to the amplifier system. Also as discussed above, the variable gain amplifier 542 may be controlled to be in one of multiple amplify modes, and each amplify mode may require, or may be optimally efficient, at a particular amplifier bias level, such as a particular bias current or bias voltage. For the example of an amplifier system 500 of FIG. 5, both the fixed gain amplifier 522 and the variable gain amplifier 542 receive independent bias currents, but in other embodiments the amplifier bias may be a bias voltage. Additionally as discussed above, within a single amplify mode the bias current to the variable gain amplifier 542 is controlled to be a lower bias current when the overall gain of the amplifier system 500 is selected to be lower, e.g., a lower output signal level at the same gain setting of the variable gain amplifier 542. Accordingly, in preparation for a data signal transmission, each of the fixed gain amplifier 522 and the variable gain amplifier 542 may be transitioned from a standby state to an enabled state, wherein their respective amplifier bias may be controlled from a standby value, such as zero, for instance, to a value necessary to transmit at a selected gain and output signal level. Further, after a data signal transmission is completed, the amplifier system 500 may be placed back into a standby state by controlling various amplifier biases to return to a standby value. Additionally, in embodiments, an amplifier system 500 may be controlled to change the gain provided, and accordingly, output signal levels, between or during transmissions without returning to a standby state. Accordingly, amplifier biases may be controlled to transition from one enabled state at a particular gain to another enabled state at a differing gain without an intermediate standby state.

As discussed above, transients in an amplifier system may generate undesirable spurious emissions at a signal output. Minimizing spurious emissions is therefore a goal of a designer of an amplifier system, and can be especially significant in a shared medium environment where spurious emissions may interfere with and possibly corrupt other users' transmissions. Aspects and embodiments of amplifier systems disclosed herein use one or more approaches to control transients to reduce spurious emissions, including controlling the timing and sequencing of events when an amplifier system changes state, ramping or incrementally stepping amplifier biases when the amplifier bias is changed, and smoothing or filtering of amplifier biases when the amplifier bias is changed. Amplifier systems in accord with aspects and embodiments disclosed herein may incorporate any one or a combination of aspects of these approaches.

An amplifier system may include various transistors, inductors, capacitors, and conductor traces, all of which may exhibit some level of reactance to electrical excitation. Accordingly, transients in electrical signals, which are transitions from one level to another, may cause longer lasting electrical fluctuations for an amount of time after the transient. Such an unintended electrical fluctuation is sometimes referred to as "ringing" by the components or the system overall, and may occur at or near a resonant frequency. Despite best efforts, all such fluctuations may not be eliminated in an amplifier system and, accordingly, care may be taken instead to prevent (or reduce) the excitation of such fluctuations. For a given circuit or system, the intensity of a resulting fluctuation may be higher when the excitation transient is higher or occurs over a short duration of time, thus controlling the level of transients may result in lower excitation which may result in lower fluctuations and therefore lower spurious emissions. Additionally, amplifiers generally amplify any signal they receive, thus if transients occur and excite electrical fluctuations in various components, care may be taken to minimize such fluctuations reaching the input of an amplifier.

Referring again to FIG. 5, in accordance with aspects of the present disclosure, the system controller 552 may control the various other components to avoid transients or resulting fluctuations, or to avoid such transients or fluctuations from reaching the output 504, which may include avoiding such transients or fluctuations from reaching various inputs of amplifier components, while such components are powered and amplifying. Accordingly, when preparing to transmit, the system controller 552 may, for example, power up the fixed gain amplifier 522 prior to powering up the variable gain amplifier 542, to prevent any transient outputs from the fixed gain amplifier 522 from being amplified by the variable gain amplifier 542. Additionally, the system controller 552 may control the switches 534 to couple the various stages together with a sequence and/or timing that further prevents or reduces transients or fluctuations at one stage from reaching the input of another stage.

For example, when the system controller 552 controls the fixed gain amplifier 522 to power up, e.g., from a standby state to an enabled state, it may control a coupling switch 534a to remain open, or non-conducting, to disable coupling between the output of the fixed gain amplifier 522 and the input of the digital switched attenuator 532. The system controller 552 may wait to enable the coupling switch 534a to couple the output of the fixed gain amplifier 522 to the input of the digital switched attenuator 532 until after any transients or fluctuations from the fixed gain amplifier 522 have settled. Additionally, the system controller 552 may control additional switches that terminate the output of the fixed gain amplifier 522, e.g., to ground or to a dummy impedance, until transients or fluctuations have settled and the output of the fixed gain amplifier 522 is ready to couple to the input of the digital switched attenuator 532. The system controller 552 may also control a bypass switch 534b and an amplify switch 534c to couple the output of the digital switched attenuator 532 to either the bypass path or the amplify path after any transients or fluctuations at the output of the digital switched attenuator 532 have settled. The system controller 552 may also control additional switches, such as the bypass switch 534b' and amplify switch 534c' to couple the output of the fixed attenuator 536 or the variable gain amplifier 542, respectively, to the output 504 after any transients or fluctuations from the fixed attenuator 536 or the variable gain amplifier 542 have settled.

Limitations for spurious emissions may sometimes be expressed in terms of power limits of such spurious emissions. Accordingly, certain voltage or current threshold values for remaining below a certain power level may depend upon an impedance of a certain medium or at a certain node, e.g., of a stage of an amplifier system or within or at a component within a stage of an amplifier system. Accordingly, a controller that waits for a transient or a fluctuation to settle, as discussed above, before selectively coupling one component of an amplifier system to another component of an amplifier system, may measure or monitor a voltage or a current at a particular node to determine whether the transient or fluctuation has settled. Further, a threshold value for such voltages (or currents) may depend upon an effective impedance. For example, the controller 552 may monitor voltage at the output of the variable gain amplifier 542 and couple the variable gain amplifier 542 to the output 504 when the voltage remains below a threshold value, the threshold voltage value being dependent upon the effective impedance of the output 504 in some examples. In some embodiments, an amount of time may be established, empirically or by theoretical calculation, as a minimum amount of time for transients or fluctuations to settle, and such minimum amount of time may depend upon an effective impedance at a node. The controller 552 may impose a waiting period based upon the minimum amount of time for transients or fluctuations to settle, in some embodiments.

Additionally, in the amplifier system 500 of FIG. 5, the fixed gain amplifier 522 may be powered up by controlling an amplifier bias provided to the fixed gain amplifier 522 and the variable gain amplifier 542 may be powered up by controlling an amplifier bias provided to the variable gain amplifier 542. While powering up an amplifier, the amplifier bias may be controlled, as discussed in more detail below, to reduce transients by smoothing or filtering the change in amplifier bias and/or by ramping or incrementally stepping the amplifier bias. Similarly, amplifiers may be put into a standby state by controlling their respective amplifier biases to reduce or remove the amplifier bias provided, and changes in the respective amplifier biases may be smoothed or ramped, or both, during the transition to standby state. Accordingly, any change in amplifier bias provided to an amplifier may be smoothed or ramped, or both, to reduce transients and fluctuations.

Figure 6:
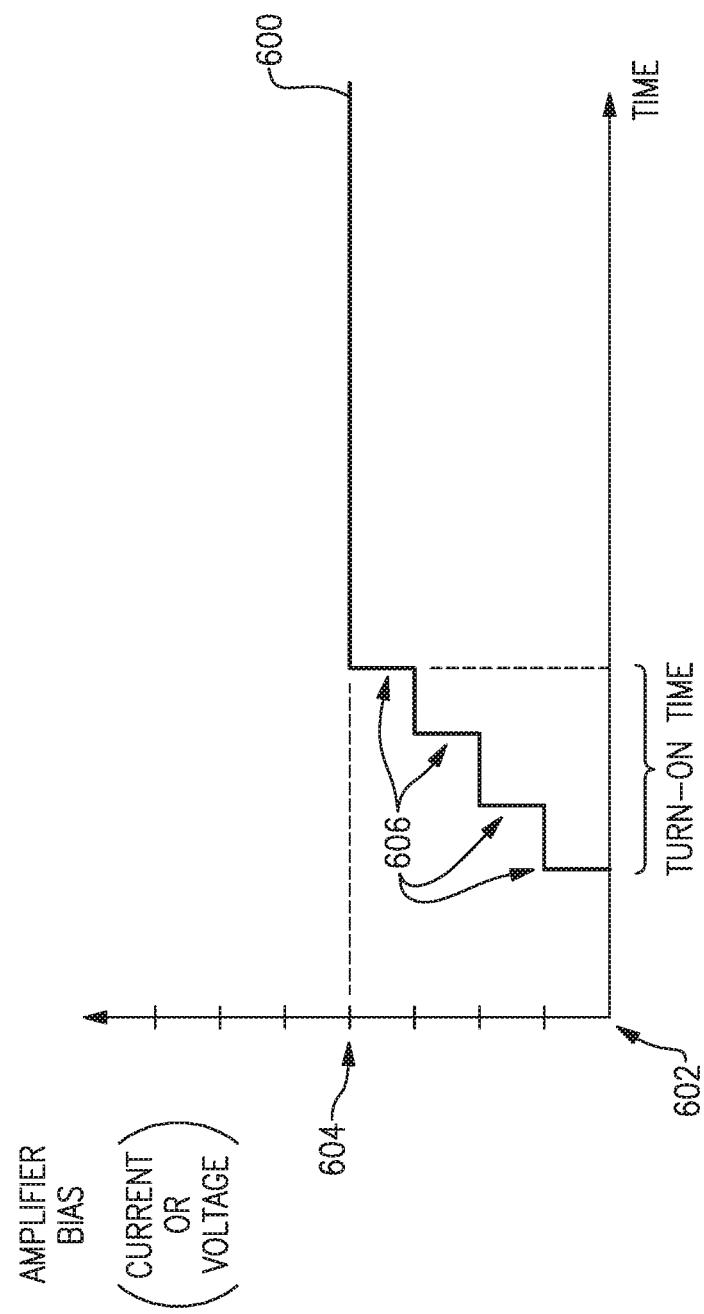
FIG. 6 is a graph of a ramped bias signal.

FIG. 6 illustrates an amplifier bias signal 600 as it is changed from an initial bias level 602 to a final bias level 604. The amplifier bias signal 600 is ramped over a plurality of steps 606 between the initial bias level 602 and the final bias level 604. Each of the steps 606 are smaller transitions than if the amplifier bias signal 600 were changed from the initial bias level 602 directly to the final bias level 604. Accordingly the transients, and any resulting fluctuations, are reduced compared to an amplifier bias signal 600 change from the initial bias level 602 directly to the final bias level 604, thereby reducing spurious emissions overall.

It is to be understood that the number, duration, and magnitude of steps 606 may vary and may be any values desired or may be selected to accommodate varying applications and operational parameters. For example, a maximum size of a step 606 may be imposed and a time limit to reach the final bias level 604 may be imposed, and the number and duration of the steps 606 may be calculated therefrom. In an alternate example, the initial bias level 602 and the final bias level 604 may be established along with a time limit to transition from the initial to the final bias levels, and a number of steps 606 may be selected to result in the minimum size of steps 606 as may be allowed by a capability of a controller, e.g., the system controller 552. In some examples, any of a step size and/or duration may be determined on the basis of a limited signal power allowed in a resulting transient or signal fluctuation. In some examples, a maximum voltage or current transient, or a minimum time between transients, may depend upon an effective impedance (e.g., at a node) to maintain spurious signal power below a threshold or limit, and a controller (such as the controller 552 or a ramp controller 700, as discussed below) may determine a step size, a time between steps, or a total time limit based upon the initial bias level, the final bias level, and the effective impedance.

While the initial bias level 602 is shown in FIG. 6 as being at zero signal level, the initial bias level 602 may be any suitable bias signal level. Likewise, while the final bias signal level 604 is shown in FIG. 6 as being greater than the initial bias signal level 602, the final bias signal level 604 may be greater or lesser than the initial bias signal level 602, and the final bias signal level 604 may be zero signal level. It is to be appreciated that an amplifier bias signal may be controlled to power up or enable an amplifier, for example as in FIG. 6, or to power down or disable an amplifier, or to change an amplifier bias signal as part of a transition from one state to another of an amplifier, e.g., as part of a change from one gain state to another or as part of a change in performance characteristic, such as a change in power efficiency, noise characteristics, linearity, or the like.

Figure 7:
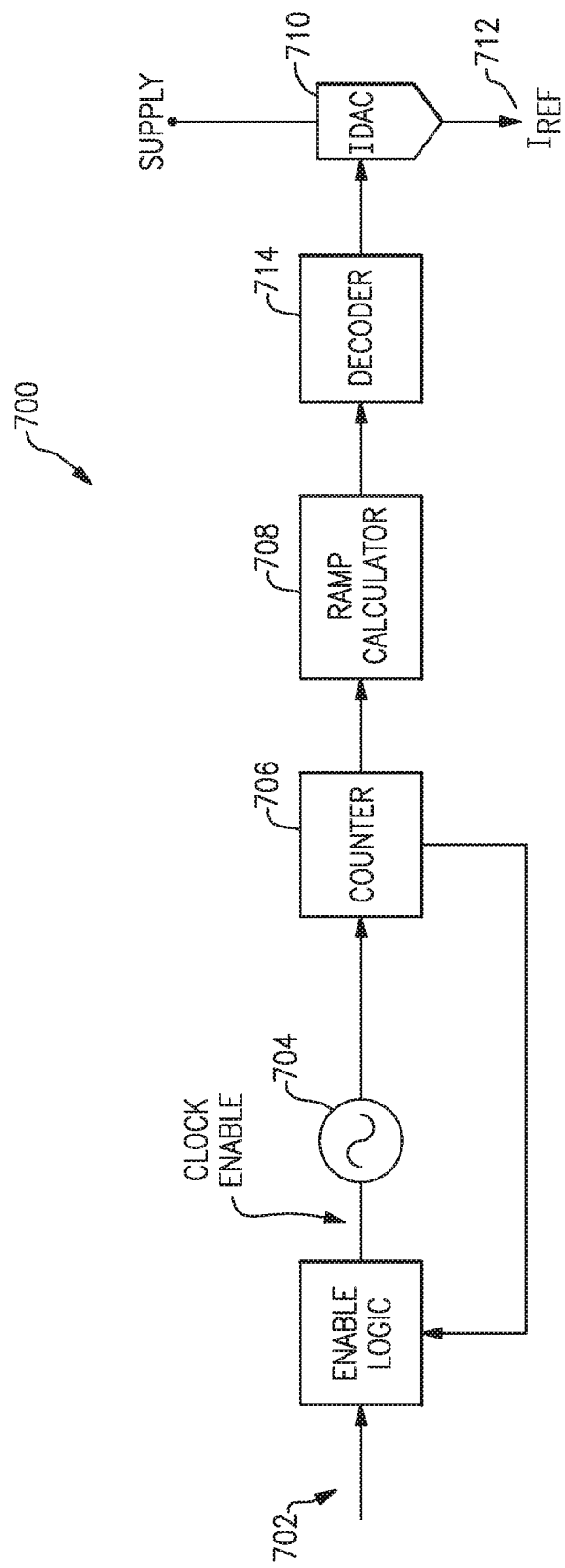
FIG. 7 is a schematic diagram of an example of a ramp controller.

FIG. 7 shows a schematic diagram of an example of a ramp controller 700, which may be a portion of a controller, e.g., the system controller 552 (see FIG. 5), to control a ramp change of a signal, such as the amplifier bias signal 600 shown in FIG. 6. When triggered by an input 702, such as a request to power up, power down, or make a state change to an amplifier, an oscillator clock 704 may be enabled to provide a timing signal to a counter 706 that keeps track of the total time passage. A ramp calculator 708 may calculate a signal level to be provided at any given time, in accord with a number of steps, a total amount of time to ramp, and the initial signal level and final signal level. A converter 710 may convert the calculated signal level into a signal 712 with the calculated level. In general, the signal 712 may be an amplifier bias signal and may be provided directly to a bias input of an amplifier, and the signal 712 may be a bias current or a bias voltage. In the ramp controller 700 of FIG. 7, the signal 712 is a bias current signal. Further, the signal 712 may be a reference current signal that, in embodiments, may be coupled to an amplifier in a manner that causes a current mirroring, e.g., a current follower, to indirectly control an amplifier bias signal. In at least one embodiment, the converter 710 is a current digital to analog converter (IDAC) and signal 712 is a reference current. In some embodiments, a ramp controller such as the ramp controller 700 of FIG. 7 may include a decoder 714 that decodes the output of the ramp calculator 708 into a format that may be received by the converter 710. In other embodiments the ramp calculator 708 may provide an output in a format directly suitable to the converter 710, for example.

The ramp controller 700 may be coupled to the variable gain amplifier 542 in a manner to cause an amplifier bias current of the variable gain amplifier 542 to mirror the reference current provided, e.g., the signal 712. The fixed gain amplifier 522 may also be provided with a reference current signal coupled in a manner to cause an amplifier bias current of the fixed gain amplifier 522 to mirror the reference current provided. Either or both of the fixed gain amplifier 522 and the variable gain amplifier 542 may be provided with independent reference current signals that control, through current mirroring or otherwise, their respective amplifier bias currents. Additionally, either of the reference current signals may be ramped, as illustrated in FIGS. 6-7, or may be smoothed, as discussed in more detail below, or both, to minimize transients during power up, power down, or other state changes.

FIGS. 8A-8C illustrate smoothing of a reference signal that may be coupled to an amplifier to cause an amplifier bias current to mirror the reference signal. FIG. 8A has a converter 802 that generates a signal 804 that is smoothed by a resistive-capacitive smoothing filter 806 to provide a smoothed signal 808. FIGS. 8B and 8C illustrate the signal 804 and the smoothed signal 808, respectively, to show their relationship to each other. While the converter 802 is shown as a current source and the signal 804 and smoothed signal 808 are each annotated as current signals, the converter 802 could instead be a voltage source and the signal 804 and smoothed signal 808 could instead be voltage signals. Additionally, while the smoothing filter 806 is shown as a CRCR network, it could alternatively be a CRC network (where, for example, the output resistor is not warranted for impedance matching) or an RCRC network (where, for example, the bias signal is a voltage bias signal) as appropriate and it could have more or fewer elements connected in varying arrangements.

In certain embodiments, a time constant of a smoothing filter, such as the smoothing filter 806, may be selected, or may be adjustable or configurable, to limit a spurious signal power level which, as discussed above, may be dependent upon the initial bias level, the final bias level, and the effective impedance. For example, one or more switch-selectable resistors and/or capacitors may be coupled in series or in parallel with other resistors and/or capacitors to selectively adjust a time constant, as known to those skilled in the art. Accordingly, in some embodiments, the time constant may be selected, configured, or adjusted based upon one or more of the step size(s), step duration(s), a total transition time limit, initial and final bias level, and effective impedance.

As discussed above, a reference current may be coupled to an amplifier in a manner to cause an amplifier bias current to mirror the reference current. Such a reference current may be ramped, as illustrated for example in FIGS. 6-7, or may be smoothed, as illustrated for example in FIGS. 8A-8C, or may be both ramped and smoothed by a combination of a ramp controller, e.g., FIG. 7, with a smoothing filter 806, e.g., as in FIG. 8A. An example of such a combination is a combination of FIG. 7 and FIG. 8A where the converter 710 and the converter 802 are one and the same.

Figure 9:
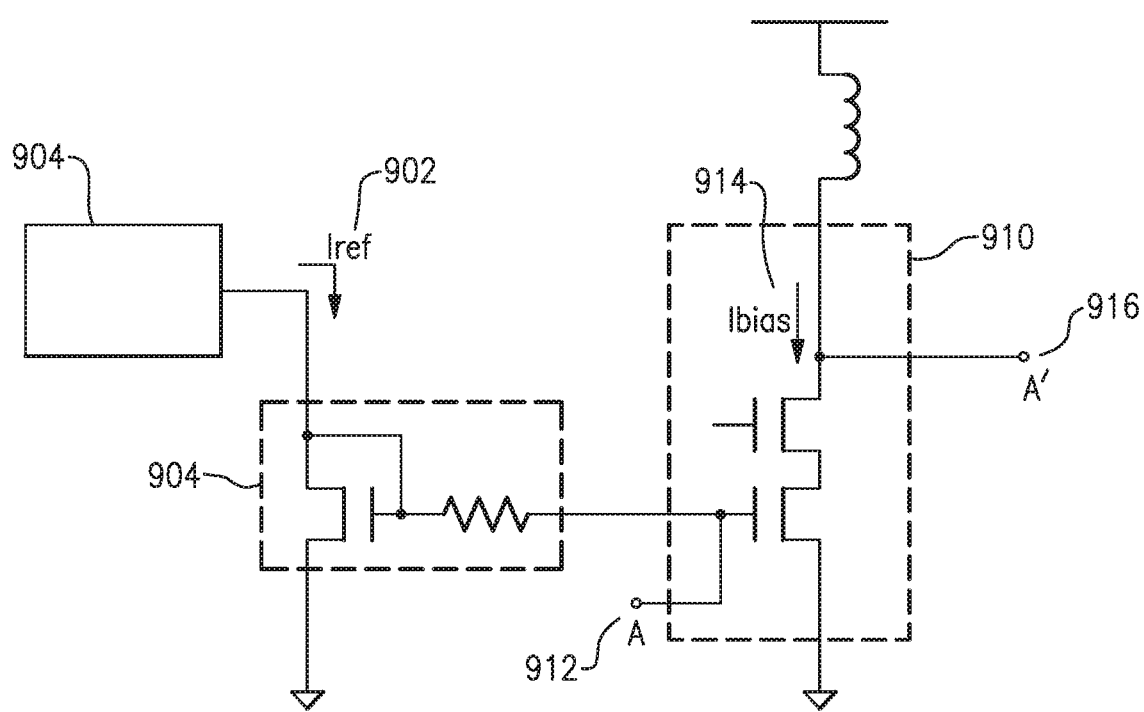
FIG. 9 is a schematic diagram of an example of a circuit for coupling a bias control to an amplifier.

FIG. 9 illustrates one example of a coupling of a reference current 902 to an amplifier 910 to cause an amplifier bias current to mirror the reference current. The reference current 902 may be generated by a generator 904, such as by the ramp controller 700 of FIG. 7, the smoothing filter 806 of FIG. 8A, or a combination of these or other reference current generators. As discussed above, the reference current 902 may be ramped or smoothed or both. The reference current 902 is shown in FIG. 9 coupled to an amplifier cell 910 via a coupling network 904. In the example shown in FIG. 9, the coupling network 904 forms a portion of a current mirror that is completed by at least a portion of the amplifier cell 910 and causes the bias current 914 to mirror the reference current 902. A signal provided at an input 912 of the amplifier cell 910 results in an amplified signal provided at an output 916. In at least one embodiment, the amplifier cell 910 may be a portion of the variable gain amplifier 542 of the amplifier system 500 shown in FIG. 5. Also in at least one embodiment the amplifier cell 910 may be a portion of the fixed gain amplifier 522 of the amplifier system 500 shown in FIG. 5.

FIG. 10 shows one example of a set of control signals that combines sequenced timing of events and ramping of an amplifier bias current for the amplifier system 500 of FIG. 5 to overall suppress transients and thereby reduce spurious emissions. Shown in FIG. 10 are five time periods for the amplifier system 500; a startup period 1010, a standby period 1020, an enable period 1030, a transmit interval 1060, and a disable period 1070. During the startup period, a chip select 1012 indicates a clocking 1014 of configuration information to establish various operating parameters, including a total gain or output signal level to be provided by the amplifier system 500.

During the standby period 1020 the amplifier system 500 is in a standby or dormant state wherein the fixed gain amplifier 522 and the variable gain amplifier 542 may be powered down and not consuming power. In the standby state, the digital switched attenuator 532 may be in an isolated mode to prevent signals from passing from the input 502 to the output 504, and vice versa. Additionally, various of the switches 534 may be in states that also prevent signals from passing from the input 502 to the output 504, and vice versa, and may also couple the fixed attenuator 536 to the output 504 to present an acceptable output impedance to any shared medium that may be coupled to the output 504, such as the coaxial medium 130 of FIG. 1. Various of the switches 534 may also be in states to couple one or more output attenuation cells of the digital switched attenuator 532 to the fixed attenuator 536 to further maintain an acceptable output impedance and to attenuate any signal received from the output 504 and to further attenuate or reduce any reflected signals from being sent back out the output 504.

When the device in which the amplifier system 500 resides, e.g., a cable modem 200 as in FIG. 2, prepares to transmit, the device signals the amplifier system 500 that it is about to transmit by a transmit enable signal 1032, which triggers the enable period 1030. In the enable period 1030, triggered by the transmit enable signal 1032, the system controller 552 enables an oscillator with an oscillator enable signal 1034. The oscillator provides a reference clock for an enable sequence as well as a disable sequence and provides reference timing during the enable period 1030 and the disable period 1070 (described in detail below). In certain embodiments, the oscillator may be temperature compensated, and may be a differential resistive-capacitive relaxation oscillator. During the enable period 1030 an example of an enable sequence includes setting 1036a a reference current value (e.g., A1_BIAS) and enabling 1036b a reference current, for the bias current of the fixed gain amplifier 522, disabling 1038 shunt switches that would otherwise terminate any signals from the output of the fixed gain amplifier 522, enabling 1040 the coupling switches 534a to couple the output of the fixed gain amplifier 522 to the input of the digital switched attenuator 532, enabling 1042 the digital switched attenuator 532, enabling 1044 the switches 534 to be in the proper configuration to route a signal through either the bypass path or the amplify path (depending upon the gain settings of the amplifier system 500), and enabling 1046 the variable gain amplifier 542. Enabling 1046 the variable gain amplifier 542 triggers an indication 1048 to set a maximum gain state (in this example) for the variable gain amplifier 542, and to enable 1050 a reference current to control an amplifier bias current of the variable gain amplifier 542. The enable 1050 triggers enabling 1052 a generator for the reference current and a ramp controller, such as the ramp controller 700 of FIG. 7, to set values 1054 for the reference current in a plurality of steps as discussed above. In some embodiments, there may be smoothing of amplifier bias signals, as described above with respect to FIGS. 8A-8C, for the fixed gain amplifier 522 and/or for the variable gain amplifier 542. When the reference current (e.g., A2_BIAS) reaches a final level, the oscillator is disabled 1056 and the enable period 1030 is completed. While this example of an enable period 1030 includes setting the gain state of the variable gain amplifier 542 to the highest gain state, other gain states may instead be indicated by the gain state indicators 1058.

When the enable period 1030 is complete, the amplifier system 500 is in a transmit interval 1060 wherein, for example, the signal processor 210 of the cable modem 200 of FIG. 2 may transmit data signals that will be received at the input 502 and provided at the output 504 with a varying signal level, depending upon the operating parameters configured during the startup period 1010. In certain embodiments, the oscillator (see, e.g., oscillator 1160 of FIG. 11A) is disabled, as illustrated at 1056 in FIG. 10, during data signal transmission, which occurs in the transmit interval 1060. Disabling the oscillator reduces or removes the possibility of spurious emissions that might otherwise be caused by the oscillator's clock signal. When transmission is complete, a transmit disable signal 1062 indicates that the amplifier system 500 should return to the standby state via a disable sequence which occurs during the disable period 1070.

The disable period 1070 is triggered by the transmit disable signal 1062 and the system controller 552 re-enables the oscillator with an oscillator enable signal 1072. As noted above, the oscillator is a reference clock for the disable sequence as well, and provides reference timing during a sequence period, such as the disable period 1070. During the disable period 1070, an example of a disable sequence illustrated in FIG. 10 includes disabling 1074 the reference current for the variable gain amplifier 542, which triggers the ramp controller, such as ramp controller 700 of FIG. 7, to set values 1076 for the reference current in a plurality of steps as discussed above to reduce the reference current, and eventually the variable gain amplifier 542 is disabled 1078 which triggers disabling 1080 the reference current generator and removing an indication 1082 of gain state before disabling 1084 the switches 534 from routing the signal through the amplify path, disabling the digital switched attenuator 532, de-coupling 1088 the output of the fixed gain amplifier 522 from the input of the digital switched attenuator 532, enabling 1090 shunt switches to terminate any signals from the output of the fixed gain amplifier 522, and disabling 1092 the reference current for the bias current of the fixed gain amplifier 522, which includes removing 1094 the value for the reference current. When the reference current that controls the bias current to the fixed gain amplifier 522 is removed 1094, the oscillator is disabled 1096 and the disable sequence is complete, leaving the amplifier system 500 in a standby state.

Also illustrated in FIG. 10 are multiple timing delays 1016 between the various sequenced actions. Each of the timing delays 1016 may be established independent of each other or may be the same, depending on operational parameters, and may be controlled by a sequencer which may be part of a controller, such as the system controller 552. In at least one embodiment, the timing delays 1016 are stored in a register and are multiples of clock cycles, which may be cycles of the oscillator clock enabled by the oscillator enable signal 1034. For example, a nominal 4 MHz clock signal may be selected in certain embodiments, in some examples because a 4 MHz fundamental frequency is outside the data signal operating frequency range (e.g., 5-204 MHz), thereby reducing or removing the possibility that any spurious emissions associated with the oscillator's clock signal will impact other transmissions on a shared medium, such as the coaxial medium 130 of FIG. 1. Such a nominal 4 MHz clock signal has a clock cycle time of 250 nanoseconds (nsec) and each of the timing delays 1016 may, in some examples, be configurable to be an integer multiple of one to four cycle times, i.e., 250 nsec, 500 nsec, 750 nsec, and 1,000 nsec. Additionally, a ramp time 1018 may be established that defines the time a ramp controller, such as the ramp controller 700 of FIG. 7, takes to transition a reference current from an initial level to a final level. In at least one embodiment, the ramp time 1018 for the reference current that controls the bias current of the variable gain amplifier 542 may be selectively configurable from among 2 microseconds (μsec), 4 μsec, 6 μsec, or 8 μsec. Other embodiments may provide for other values of timing delays 1016 or ramp time 1018. Additionally, other embodiments may include controllers that use elements other than an oscillator clock to control the timing between events.

Table 3 illustrates a set of registers that may be configured, read from, or written to, that may be used by a controller, such as the system controller 552, in controlling an amplifier system, such as the amplifier system 500, to implement the events and timing sequences illustrated in FIGS. 10 and 12-14.

TABLE 3

| Register Name | Data Bits | Bit Name | Type | Description |
|---|---|---|---|---|
| Gain Control | 5:0 | GC | RW | Gain code |
| | | | | 0 × 05: −23.0 dB |
| | | | | 0 × 06: −22.0 dB |
| | | | | . . . |
| | | | | 0 × 3F: +35.0 dB |

TABLE 3-continued

| Register Name | Data Bits | Bit Name | Type | Description |
|---|---|---|---|---|
| Bias Control 1 | 4:0 | A1IBIAS | RW | A1 Bias current control |
| Bias Control 2 | 4:0 | A2IBIAS | RW | A2 Bias current control |
| Sequencer Control 1 | 7:6 | TIMSEQ4 | RW | PA_SW_EN timing control<br>0 × 0: 250 ns<br>0 × 1: 500 ns<br>0 × 2: 750 ns<br>0 × 3: 1 us |
| | 5:4 | TIMSEQ3 | RW | DSA_EN timing control<br>0 × 0: 250 ns<br>0 × 1: 500 ns<br>0 × 2: 750 ns<br>0 × 3: 1 us |
| | 3:2 | TIMSEQ2 | RW | LNA_SW_EN timing control<br>0 × 0: 250 ns<br>0 × 1: 500 ns<br>0 × 2: 750 ns<br>0 × 3: 1 us |
| | 1:0 | TIMSEQ1 | RW | LNA_SH_EN timing control<br>0 × 0: 250 ns<br>0 × 1: 500 ns<br>0 × 2: 750 ns<br>0 × 3: 1 us |
| Sequencer Control 2 | 7:4 | RSVD | RO | Reserved for future use |
| | 3:2 | RMPSEQ | RW | A2IBIAS ramp control<br>0 × 0: 0 us<br>0 × 1: 2 us<br>0 × 2: 4 us<br>0 × 3: 8 us |
| | 1:0 | TIMSEQ5 | RW | A2_EN timing control<br>0 × 0: 250 ns<br>0 × 1: 500 ns<br>0 × 2: 750 ns<br>0 × 3: 1 us |
| Enable Status | 7 | A2MAX | RO | A2_MAX status |
| | 6 | A2MED | RO | A2_MED status |
| | 5 | A2MIN | RO | A2_MIN status |
| | 4 | A2EN | RO | A2_EN status |
| | 3 | PASWEN | RO | PA_SW_EN status |
| | 2 | DSAEN | RO | DSA_EN status |
| | 1 | LNASWEN | RO | LNA_SW_EN status |
| | 0 | LNASHEN | RO | LNA_SH_EN status |

In addition to ramping and smoothing of bias signals, and sequencing and timing of events, an output such as output 504 of FIG. 5, or an output of the variable gain amplifier 542, may be switchably connectable to an output terminal, such as by the switches 534b' and 534c' or by other switches. The output terminal may therefore be switchably disconnected or connected to the components of the amplifier assembly to further prevent spurious emissions and/or to switchably connect impedances, such as termination impedances, to present a consistent output impedance to a cable, such as the coaxial cable 280 shown in FIG. 2, during transitions of the amplifier system.

Figure 11A:
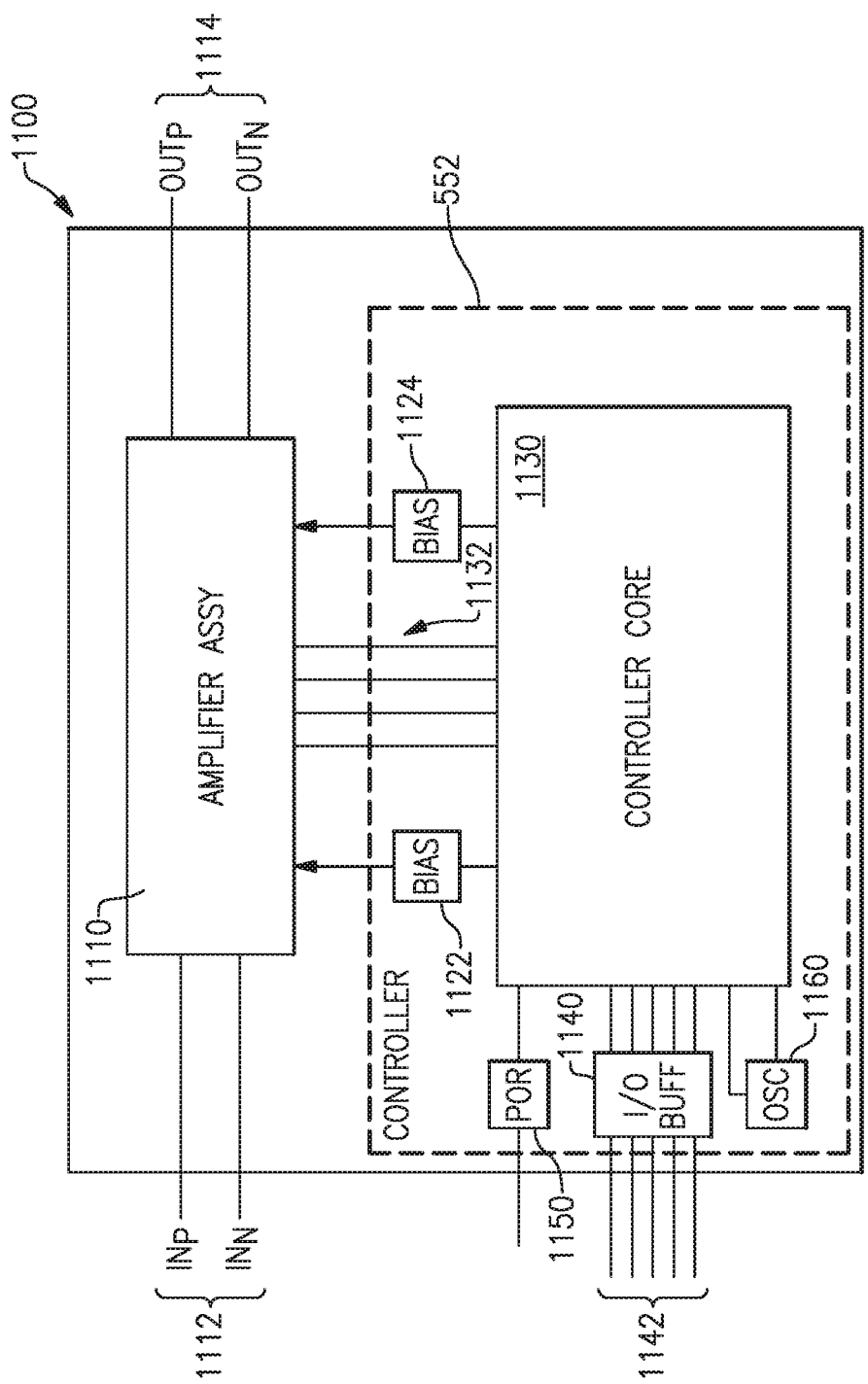
FIG. 11A is a schematic diagram of another example of an amplifier system.

Referring to FIG. 11A, there is illustrated one example of a system 1100 incorporating an amplifier assembly 1110, which may include the amplifier system 300, for example, and a controller 552. The amplifier assembly 1110 receives an input 1112 and provides an amplified output 1114. As shown in FIG. 11A, the input 1112 may be a differential input, and the output 1114 may be a differential output.

The controller 552 may include first and second bias circuits 1122 and 1124 for biasing components of the amplifier assembly 1110, such as the fixed gain amplifier 522 and the variable gain amplifier 542 of FIG. 5, as discussed above. For example, the bias circuit 1124 may include a ramp generator, such as illustrated in FIG. 7, to control an IDAC (such as the IDAC 710, 802 of FIGS. 7 and 8, respectively), and may include a smoothing filter (such as the smoothing filter 806 of FIG. 8), to generate a current that is applied to, e.g., the variable gain amplifier 542 of FIG. 5, in a manner such as that shown in FIG. 9, to control a bias current (e.g., the bias current 914 as illustrated in FIG. 9). Similarly, the bias circuit 1122 may include a ramp generator (or a step generator, for example) to control an IDAC whose output current is smoothed by a smoothing filter and applied as a reference current, to control a bias current of the fixed gain amplifier 522 of FIG. 5.

Figure 11B:
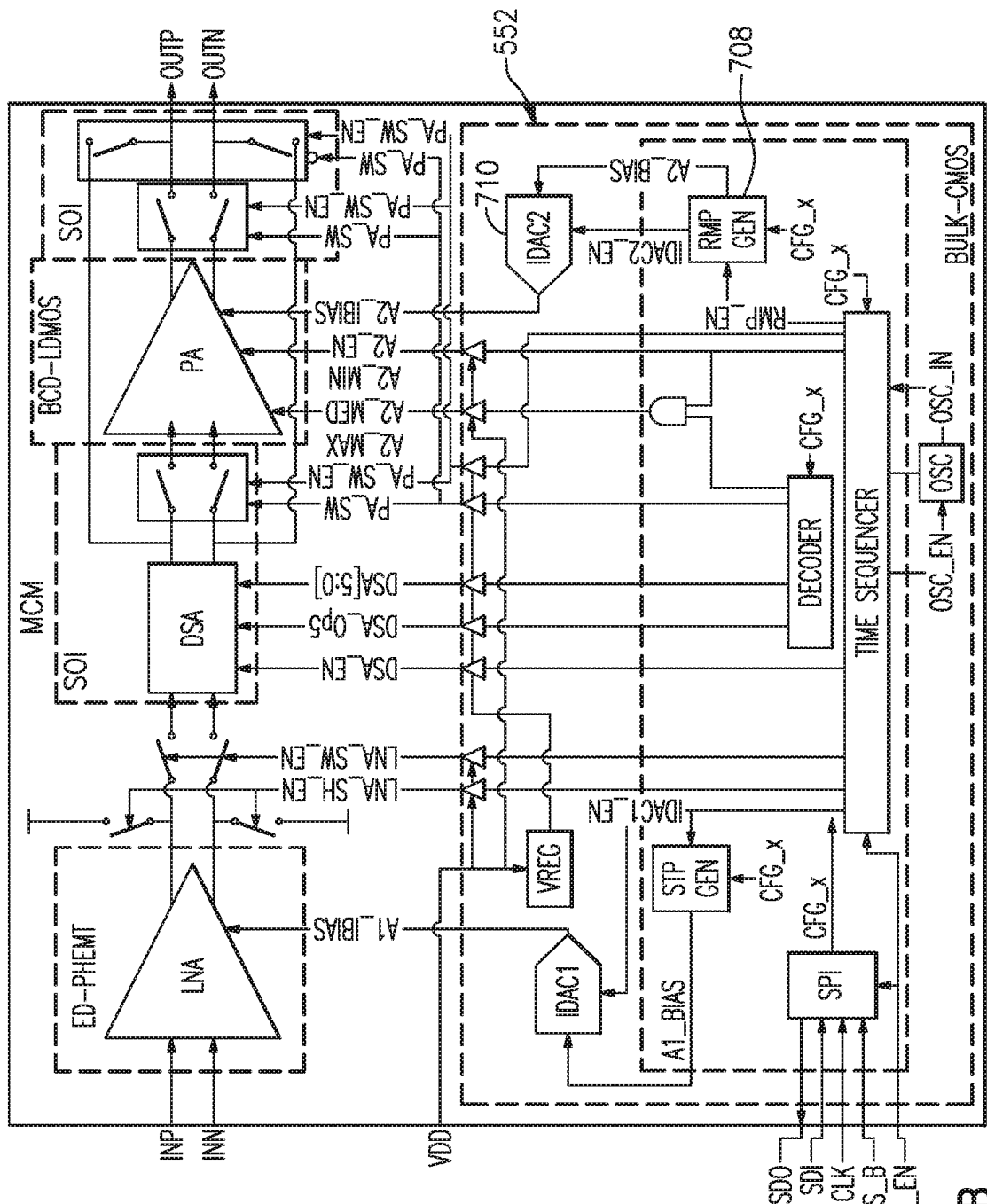
FIG. 11B is a schematic diagram of another example of an amplifier system.

For example, the amplifier assembly 1100 is illustrated in more detail in FIG. 11B, and shows the ramp calculator 708 (e.g., a ramp generator) providing a bias level (e.g., A2_BIAS) to the IDAC 710. The IDAC 710 in FIG. 11B may also correspond to the IDAC 802 shown in FIG. 8, wherein the output current form the IDAC 802 is smoothed by a smoothing filter 806. Operation of the ramp generator and IDAC, with or without smoothing, provides a reference current that controls a bias current (or voltage in some examples) to an amplifier, e.g., the variable gain amplifier 340, 542).

Referring again to FIG. 11A, the controller 552 includes a controller core 1130 that may provide additional control signals to the amplifier assembly 1110 via control line(s) 1132. As discussed above, the controller core 1130 may provide control signals to control attenuation settings, gain settings, signal routing switches, power supply settings, and other components (as illustrated in some instances with greater detail in FIG. 11B) to establish operational characteristics of the amplifier assembly 1110, for example. The controller core 1130 may receive instructions or commands from one or more external components, as discussed above, and may provide feedback or other information to one or more external components over signal line(s) 1142, which may be optionally routed through an input/output buffer 1140.

In certain examples, the controller 552 includes a power-on-reset circuit 1150 that establishes a startup configuration. For example, when power is applied, the power-on-reset circuit 1150 may clear or reset registers or other memory, set registers to appropriate initial values, establish baseline parameters via the control lines 1132, reset the input/output buffer 1140, and establish initial communication or parameters for the signal line(s) 1142. The power-on-reset circuit 1150 may also, directly or through such registers mentioned above, ensure that various signal switches, such as the switches 534 of FIG. 5, are in appropriate positions to limit transients or fluctuations and/or to maintain input or output impedances, and that various signal switches and/or control settings of an attenuator, such as the adjustable attenuator 532 of FIG. 5, are appropriate to limit transients or fluctuations and/or to maintain input or output impedances.

The controller 552 may further include an oscillator 1160 in communication with the controller core 1130. The oscillator 1160 may provide a reference signal to allow the controller 552 to control the timing of changes applied to various components to prevent or reduce conflicts, electrical shorts, spurious emissions, signal transients, disallowed or undesirable states, or changes in input or output impedances, and the like, as discussed above.

Figure 13:
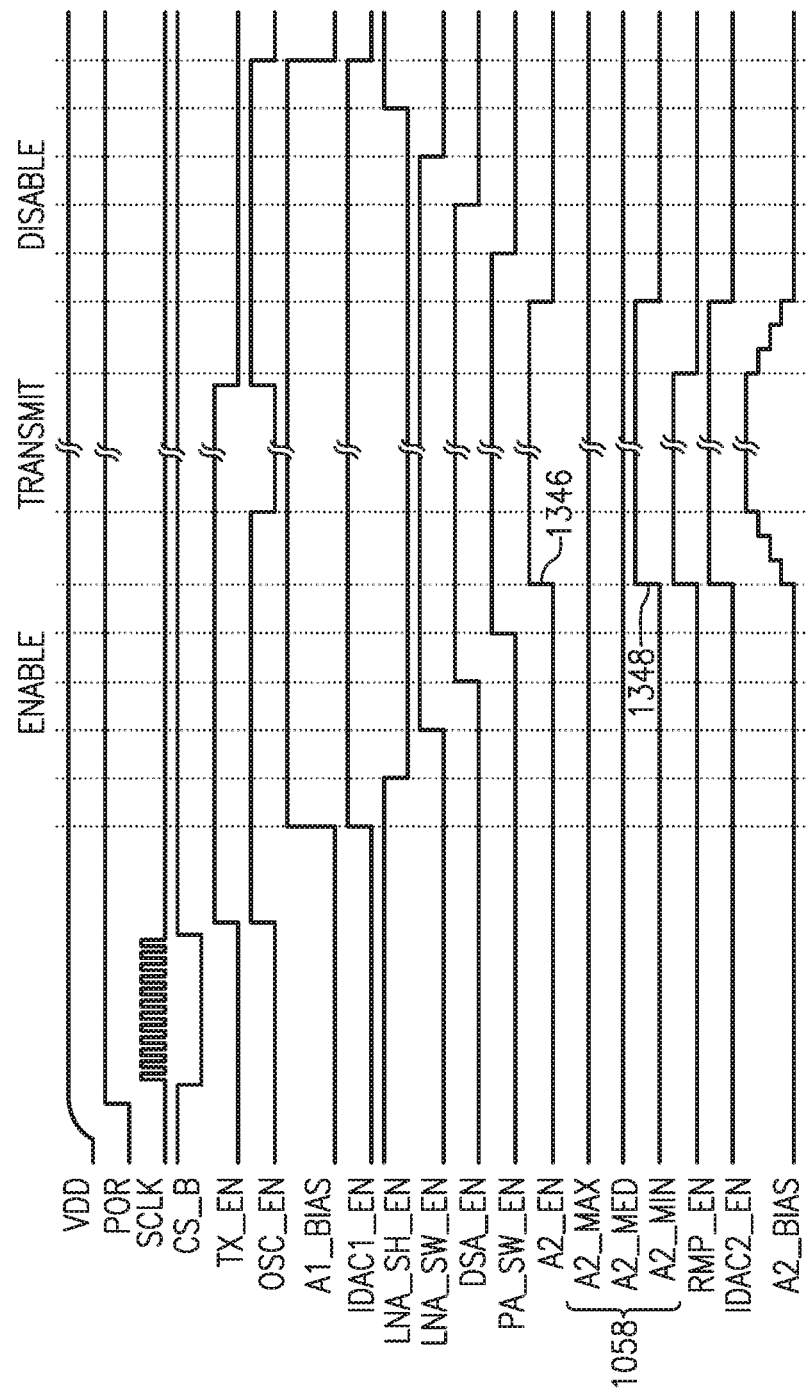

FIGS. 12-14 illustrate timing diagrams similar to that shown in FIG. 10 but for a medium gain state, a low gain state, and a bypass state of the output stage, respectively. For example, each of FIGS. 12-14 differs from FIG. 10 in regards to which of the gain state indicators 1058 are selected. In FIG. 12, when the variable gain amplifier 542 is enabled 1246, a medium gain state is selected 1248, while in FIG. 13 when the variable gain amplifier 542 is enabled 1346, a minimum gain state is selected 1348. FIG. 14 further illustrates a lowest gain state wherein the output stage is in a bypass mode and the variable gain amplifier 542 remains disabled 1446.

With further reference to FIGS. 10-14, bias values shown, e.g., A1_BIAS, A2_BIAS, represent values that establish a reference current, $I_{ref}$, (or voltage), as in FIGS. 7-9, provided to an amplifier, such as the fixed gain amplifier 552 (e.g., A1) or the variable gain amplifier 542 (e.g., A2), that may determine a bias current (or voltage) provided to the respective amplifier.

Having described above several aspects of at least one example, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A method of suppressing spurious emissions from an amplifier having an output switchably coupled to an output terminal and having a plurality of bias levels, the method comprising:
   initiating a change in a level of a bias signal provided to the amplifier from an initial bias level to a final bias level;
   determining a period of time over which the level of the bias signal is to be ramped from the initial bias level to the final bias level based on a difference between the initial bias level and the final bias level and an effective impedance of the output terminal as seen by a medium coupled to the output terminal; and
   ramping the level of the bias signal from the initial bias level to the final bias level over the period of time and over a plurality of steps, the plurality of steps including at least one step in which the level of the bias signal is between the initial bias level and the final bias level.

2. The method of claim 1 wherein the initial bias level corresponds to a disabled state of the amplifier and the final bias level corresponds to an enabled state of the amplifier.

3. The method of claim 1 wherein the initial bias level corresponds to a state in which the amplifier provides a first gain and the final bias level corresponds to a state in which the amplifier provides a second gain, the second gain being different than the first gain.

4. The method of claim 3 wherein the first gain is less than the second gain.

5. The method of claim 3 wherein the first gain is more than the second gain.

6. The method of claim 1 further comprising:
   determining a number of steps in the plurality of steps based on the difference between the initial bias level and the final bias level.

7. The method of claim 6 further comprising:
   determining the number of steps in the plurality of steps based on the difference between the initial bias level and the final bias level and based on the determined period of time.

8. The method of claim 1 further comprising switchably coupling the output of the amplifier to the output terminal subsequent to ramping the level of the bias signal from the initial bias level to the final bias level.

9. The method of claim 8 further comprising switchably decoupling the output of the amplifier from the output terminal prior to ramping the level of the bias signal from the initial bias level to the final bias level over the plurality of steps.

10. A method of suppressing spurious emissions from an amplifier having an output switchably coupled to an output terminal and having a plurality of bias levels, the method comprising:
    initiating a change in a level of a bias signal provided to the amplifier;
    determining a difference between an initial bias level and a final bias level of the bias signal; and
    ramping the level of the bias signal from the initial bias level to the final bias level over a period of time that is based upon the difference between the initial bias level and the final bias level and based upon an effective impedance of the output terminal as seen by a medium coupled to the output terminal.

11. The method of claim 10 further comprising determining the effective impedance of the output terminal as seen by the medium coupled to the output terminal.

12. The method of claim 11 wherein the bias signal is provided to the amplifier via a resistive-capacitive circuit, and the period of time is further based upon a time constant of the resistive-capacitive circuit.

13. The method of claim 12 wherein the resistive-capacitive circuit is adjustable, the method further comprising adjusting the resistive-capacitive circuit to adjust the time constant of the resistive-capacitive circuit.

14. The method of claim 10 wherein the bias signal is provided to the amplifier via a resistive-capacitive circuit, and the period of time is further based upon a time constant of the resistive-capacitive circuit.

15. The method of claim 10 further comprising switchably coupling an output of the amplifier to Drill the output terminal subsequent to ramping the level of the bias signal from the initial bias level to the final bias level.

16. The method of claim 15 further comprising switchably decoupling the output of the amplifier from the output terminal prior to ramping the level of the bias signal from the initial bias level to the final bias level over the plurality of steps.

17. A method of suppressing spurious emissions from an amplifier having a plurality of bias levels, the method comprising:
    initiating a change in a level of a bias signal provided to the amplifier from a first bias level to a second bias level;
    determining whether a difference between the first bias level and the second bias level is greater than a threshold that may cause spurious emissions; and
    ramping the level of the bias signal from the first bias level to the second bias level over a plurality of steps in response to a determination that the difference between the first bias level and the second bias level is greater than the threshold.

18. A method of reducing spurious emissions in a multi-stage amplifier assembly, the method comprising:
    enabling a first stage of the multi-stage amplifier assembly, the first stage being an input amplifier stage;
    selectively coupling the first stage to a second stage of the multi-stage amplifier assembly, the second stage being an attenuator;
    selectively coupling the second stage to a third stage of the multi-stage amplifier assembly, the third stage being an output amplifier stage;
    enabling the third stage; and selectively coupling the third stage to a signal output terminal subsequent to performing all of the above.

19. A method of reducing spurious emissions in a multi-stage amplifier assembly, the method comprising:
enabling a first stage of the multi-stage amplifier assembly, the first stage being an input amplifier stage;
selectively coupling the first stage to a second stage of the multi-stage amplifier assembly, subsequent to enabling the first stage, the second stage being an attenuator;
selectively coupling the second stage to a third stage of the multi-stage amplifier assembly, subsequent to coupling the first stage to the second stage, the third stage being an output amplifier stage; and
enabling the third stage, subsequent to coupling the second stage to the third stage.

20. A method of suppressing spurious emissions from an amplifier having a plurality of bias levels, the method comprising:
changing a level of a bias signal provided to the amplifier from an initial bias level to a final bias level;
determining whether spurious emissions resulting from the changing of the level of the bias signal have subsided; and
switchably connecting an output of the amplifier to an output terminal in response to the determination that the spurious emissions resulting from the changing level of the bias signal have subsided.

21. The method of claim 20 wherein the initial bias level corresponds to a disabled state of the amplifier and the final bias level corresponds to an enabled state of the amplifier.

22. The method of claim 20 wherein the initial bias level corresponds to a state in which the amplifier provides a first gain and the final bias level corresponds to a state in which the amplifier provides a second gain, the second gain being different than the first gain.

23. The method of claim 22 wherein the first gain is less than the second gain.

24. The method of claim 22 wherein the first gain is more than the second gain.

25. The method of claim 20 further comprising switchably connecting the output terminal to a load prior to changing the level of the bias signal.

26. The method of claim 25 wherein the load is one of a switchable attenuator and a signal path different from the output of the amplifier.

27. The method of claim 25 wherein the load is a switchable attenuator, the method further comprising configuring the switchable attenuator into an isolation mode prior to switchably connecting the output terminal to the load, the isolation mode providing attenuation and a terminating impedance.

* * * * *

UNITED STATES PATENT AND TRADEMARK OFFICE
CERTIFICATE OF CORRECTION

PATENT NO.         : 10,554,188 B2
APPLICATION NO.    : 15/808372
DATED              : February 4, 2020
INVENTOR(S)        : Adrian John Bergsma et al.

Page 1 of 1

It is certified that error appears in the above-identified patent and that said Letters Patent is hereby corrected as shown below:

In the Claims

Column 26, Claim 15, Line number 35, delete "Drill".

Signed and Sealed this
Twelfth Day of May, 2020

Andrei Iancu
*Director of the United States Patent and Trademark Office*